United States Patent [19]
Suehiro et al.

[11] Patent Number: 5,623,181
[45] Date of Patent: Apr. 22, 1997

[54] MULTI-LAYER TYPE LIGHT EMITTING DEVICE

[75] Inventors: Yoshinobu Suehiro; Shigeru Yamazaki; Takashi Sato, all of Gyoda, Japan

[73] Assignee: Iwasaki Electric Co., Ltd., Tokyo, Japan

[21] Appl. No.: 409,099

[22] Filed: Mar. 23, 1995

[51] Int. Cl.$^6$ .................... H01J 1/62; H01J 5/16; H01L 33/00

[52] U.S. Cl. .............. 313/512; 313/498; 313/110; 313/113; 313/114; 257/98

[58] Field of Search ................... 313/498, 499, 313/501, 110, 113, 114, 512; 257/98; 362/800, 240, 241, 243, 247, 249

[56] References Cited

U.S. PATENT DOCUMENTS

| | | | |
|---|---|---|---|
| 3,462,605 | 8/1969 | Engeler | 257/98 |
| 3,875,456 | 4/1975 | Kano et al. | |
| 4,560,901 | 12/1985 | Thillays | 313/499 |
| 4,630,183 | 12/1986 | Fujita | 313/499 |

FOREIGN PATENT DOCUMENTS

927549 U  8/1992  Germany.

OTHER PUBLICATIONS

Patent Abstracts Of Japan vol. 018 No. 270 (E-1552), 23 May 1994.
Patent Abstracts Of Japan vol. 013 No. 401 (E-816), 6 Sep. 1989.
Patent Abstracts Of Japan vol. 016 No. 551 (P-1453), 20 Nov. 1992.
Patent Abstracts Of Japan vol. 018 No. 080 (E-1505), 9 Feb. 1994.

*Primary Examiner*—Sandra L. O'Shea
*Assistant Examiner*—John Ning
*Attorney, Agent, or Firm*—Rabin, Champagne & Lynt, P.C.

[57] ABSTRACT

Disclosed is a multi-layer type light emitting device including: at least two light emitting sources disposed to be multi-layered; and an optical surface disposed so as to correspond to each of the light emitting sources excluding one positioned at the rearmost stage for forwardly reflecting rays of light emitted by the light emitting source and transmitting rays of light emitted by the light emitting source disposed at the rear stage. With this device, rays of light emitted by each of the light emitting sources excluding one positioned at the rearmost stage are reflected from the corresponding optical surface and radiated forwardly. In this case, when a different optical surface is disposed on the front stage, the rays of light transmit the optical surface and are radiated to the exterior. In the case where rays of light emitted by the light emitting source positioned on the rearmost stage are radiated forwardly, they transmit the optical surface positioned at the front stage and are radiated to the exterior. Accordingly, rays of light emitted by the multi-layered light emitting sources are radiated from the same plane to the exterior.

21 Claims, 19 Drawing Sheets

MULTI-LAYER TYPE LIGHT EMITTING DEVICE

BACKGROUND OF THE INVENTION

1. Field of the Invention

The present invention relates to a light emitting device used for displays, sensors and the like.

2. Description of the Prior Art

A light emitting diode (LED) in the prior art will be described with reference to FIGS. 34 and 35. FIG. 34 is a schematic sectional view of a prior art LED of the so-called lens type, and FIG. 35 is a schematic sectional view of an LED of a reflection type.

A lens type LED 1000 shown in FIG. 34 has an LED chip 1001a emitting rays of red light; an LED chip 1001b emitting rays of green light; lead frames 1002a, 1002b, 1002c; light diffusible material 1003; light transmissible material 1004; and a lens surface 1005. The LED chips 1001a, 1001b are mounted on the lead frame 1002a, and electrically connected to the lead frames 1002b, 1002c by way of wires 1006a, 1006b, respectively. The LED chips 1001a, 1001b, and part of the wires 1006a, 1006b are sealed by means of the light diffusible material 1003 layered on the lead frame 1002a. The light diffusible material 1003, wires 1006a, 1006b, and the leading edge portions of the lead frames 1002a, 1002b, 1002c are integrally sealed by means of the light transmissible material 1004. The lens surface 1005 is formed by a method wherein the surface of the light transmissible material 1004 is formed in a convex shape on the light emitting surface side of the LED chips 1001a, 1001b.

In the lens-type LED 1000 having the above construction, rays of red light emitted by the LED chip 1001a and rays of green light emitted by the LED chip 1001b are diffused and mixed by the light diffusible material 1003, after which they are collected by the lens surface 1005 and radiated to the exterior. Thus, rays of light having different luminous colors can be radiated from the lens surface 1005 to the exterior with approximately the same luminous intensity distribution characteristics, and accordingly, rays of mixed light with no color-irregularity can be radiated to the exterior.

In the lens-type LED 1000 having the above construction, however, rays of light emitted by the LED chips 1001a, 1001b are sufficiently diffused by the light diffusible material 1003, and thereby they are uniformly radiated in all the directions from the surface of the light diffusible material 1003. Consequently, only part of the rays of light radiated from the surface of the light diffusible material 1003 reach the lens surface 1005. Since part of the rays of light emitted by the LED chips 1001a, 1001b are absorbed by the light diffusible material 1003, only part of the rays of light emitted by the LED chips 1001a, 100b can be radiated from the lens surface 1005. In the meanwhile, although the light diffusible material 1003 is substantially taken as a light source portion in the lens type LED 1000 having the above construction, it is larger than the LED chip and cannot be taken as a point light source, thus failing to perform sufficient optical control by the lens surface 1005. Accordingly, the lens-type LED 1000 in the prior art having the above construction presents a problem that it is significantly poor in collecting efficiency and cannot obtain a high frontal luminance. For example, a lens type LED having a structure shown in FIG. 34, which is prepared such that two LED chips are used to obtain sufficient color mixing, exhibits a frontal luminance being about ¹⁄₂₀ that of a lens-type LED which is sealed only by a light transmissible material without any light diffusible material.

A reflection type LED 1100 shown in FIG. 35 has an LED chip 1101a emitting rays of red light; an LED chip 1101b emitting rays of green light; lead frames 1102a, 1102b; a light transmissible material 1103; and a concave surface-like reflection surface 1105 provided to face the light emitting surface of the LED chips 1101a, 1101b. The LED chips 1101a, 1101b are mounted on the lead frames 1102a, 1102b, and are electrically connected to respective lead frames (not shown) by means of respective wires (not shown). The LED chips 1101a, 1101b, the leading edge portions of the lead frames 1102a, 1102b, the leading edge portions of the lead frames (not shown) and the wires (not shown) are integrally sealed by the light transmissible material 1103. The concave surface-like reflection surface 1105 is formed on a convex surface of the light transmissible material 1103.

In the reflection-type LED 1100 having the above construction, the whole luminous flux of red light emitted by the LED chip 1101a and the whole luminous flux of the green light emitted by the LED chip 1101b are almost entirely reflected from the concave surface-like reflection surface 1105 and radiated to the exterior. Accordingly, the reflection-type LED 1100 having the above construction can obtain a frontal luminance higher than that of the prior art lens-type LED 1000 shown in FIG. 34.

In the reflection-type LED 1100, however, it is unclear what structure is most suitable for effectively mixing rays of red light emitted by the LED chip 1101a and rays of green light emitted by the LED chip 1101b. In addition, it may be considered a structure of integrally sealing the LED chip 1101a and the LED chip 1101b with a light diffusible material; however, this structure presents a problem in shielding rays of light reflected from the concave surface-like reflection surface 1105 by the light diffusible material.

SUMMARY OF THE INVENTION

In view of the foregoing, the present invention has been made, and an object of the present invention is to provide a multi-layer-type light emitting device capable of effectively mixing rays of light with different luminous colors and radiating the rays of mixed light.

To achieve the above object, according to the present invention, there is provided a multi-layer-type light emitting device including: at least two light emitting sources disposed to be multi-layered; and an optical surface disposed so as to correspond to each of the light emitting sources excluding one positioned at the rearmost stage for forwardly reflecting rays of light emitted by the light emitting source and transmitting rays of light emitted by the light emitting source disposed at the rear stage.

According to the present invention, rays of light emitted by each of light emitting sources excluding one provided on the rearmost stage are reflected from the corresponding optical surface and radiated forwardly. The rays of light reflected from each optical surface and radiated forwardly transmit another optical surface (if provided in the front stage), and are radiated to the exterior. In the case where rays of light emitted by the light emitting source provided at the rearmost stage are radiated forwardly, they transmit the optical surface positioned on the front stage and are radiated to the exterior. Accordingly, rays of light emitted by the light emitting sources disposed to be multi-layered can be radiated from the same plane to the exterior, so that when rays of light with different luminous wavelength ranges are emitted by respective light emitting sources, it becomes possible to effectively mix and radiate rays of light with different colors.

DESCRIPTION OF THE PREFERRED EMBODIMENTS

Hereinafter, a first embodiment of the present invention will be described with reference to FIGS. 1 to 4. Additionally, in FIG. 2, LED chips, leads and the like constituting an LED are omitted.

Figure 1:
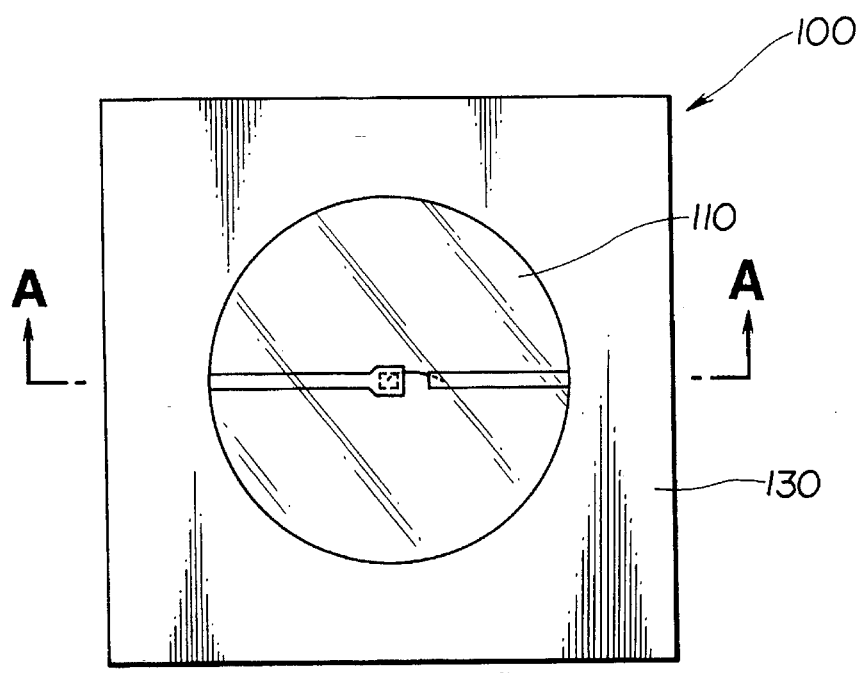
FIG. 1 is a schematic front view of a multi-layer type light emitting device as a first embodiment of the present invention.
Figure 2:
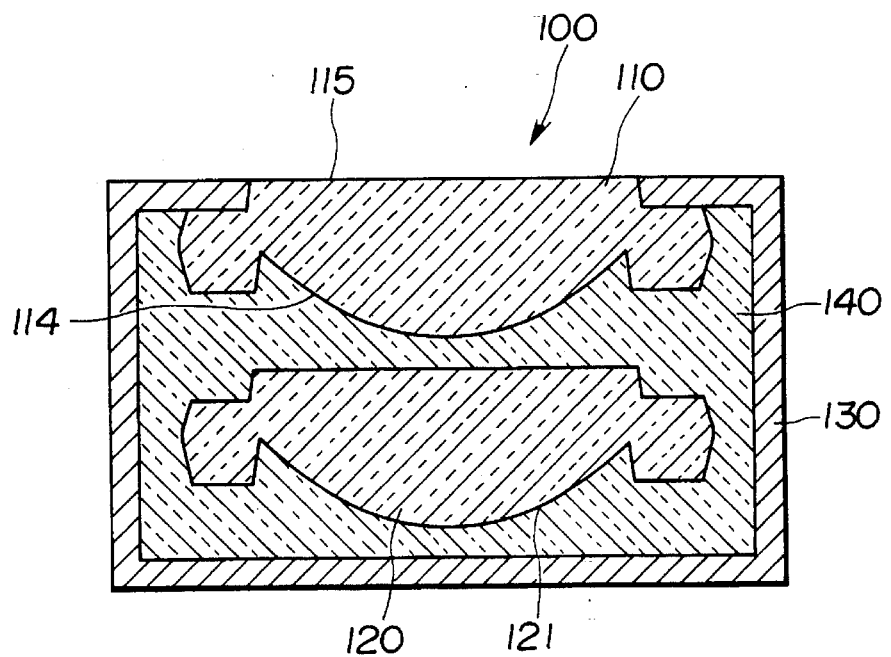
FIG. 2 is a schematic sectional view taken along line A—A of the multi-layer type light emitting device shown in FIG. 1.

As shown in FIGS. 1 and 2, a multi-layer-type light emitting device 100 as the first embodiment of the present invention: has an LED 110; a rearmost LED 120 disposed on the rear stage of the LED 110; a case 130 for containing the LEDs 110, 120; and a light transmissible material 140 filling the interior of the case 130.

Figure 3:
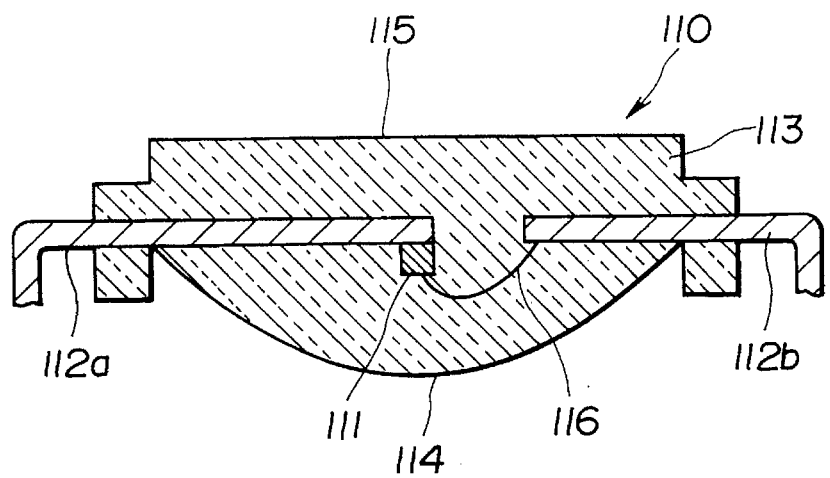
FIG. 3 is a view showing an LED used in the multi-layer-type light emitting device as the first embodiment.
Figure 4:
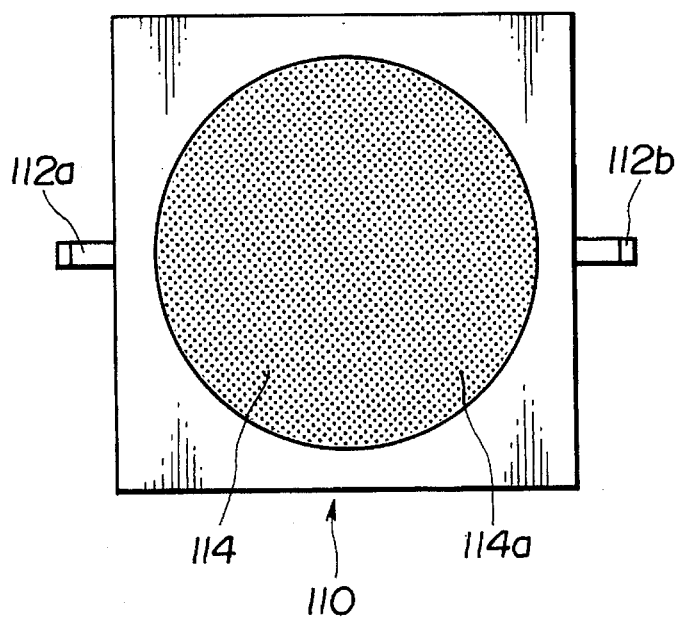
FIG. 4 is a schematic bottom view (seen from the optical surface side) of the LED shown in FIG. 3.

As shown in FIG. 3, the LED 110 has: a PN junction type chip (hereinafter, referred to as "LED chip") 111 as a light emitting source; lead frames 112a, 112b for supplying power to the LED chip 111; a light transmissible material 113 made of epoxy resin, low melting point glass or the like; an optical surface 114 provided to face the light emitting surface of the LED chip 111; and a radiation surface 115 provided on the back surface side of the LED chip 111. The LED chip 111 emits rays of red light. It is mounted at the leading edge portion of the lead frame 112a and is electrically connected to the lead frame 112b by means of a wire 116. The LED chip 111, the leading edge portions of the lead frames 112a, 112b and the wire 116 are integrally sealed by the light transmissible material 113. In addition, the light transmissible material 140 filling the interior of the case 130 is desirable to have a refractive index similar to that of the light transmissible material 113. This prevents that rays of light emitted by the LED 120 from being refracted at the interface of the optical surface 114 and radiated in ineffective directions and being reflected from the interface of the optical surface 114 and reduced in transmissivity. As shown in FIG. 4, the optical surface 114 is formed with a plurality of dotted reflection portions 114a by a method wherein the convex surface of the light transmissible material 113 is partially subjected to mirror-surface treatment by plating, metal deposition, or the like, of Ag, Al or the like. It is formed in a revolving parabolic shape focussed on the LED chip 111. The radiation surface 115 is on the flat surface of the light transmissible material 113.

The rearmost LED 120 is different from the LED 110 in that the LED chip 111 emitting rays of red light is replaced with an LED chip (not shown) emitting rays of green light as the rearmost light emitting source, and that the optical surface 114 formed with a plurality of dotted reflection portions 114a is replaced with a reflection surface 121 having a revolving parabolic shape focussed on the LED chip. The reflection portion 121 is formed by a method wherein the whole convex surface of the light transmissible material is subjected to mirror-surface treatment by plating, metal deposition, or the like, of Ag, Al or the like. The other structures are the same as those in the LED 110, and accordingly, parts in the LED 120 which have the same functions as those in the LED 110 are indicated by the same or corresponding characters and the detailed explanation thereof is omitted.

In the multi-layer-type light emitting device 100 having the above construction, part of the rays of red light emitted by the LED chip 111 of the LED 110 are reflected from a plurality of the dotted reflection portions 114a (shown by black portions in FIG. 4) formed on the optical surface 114 in the direction approximately parallel to the center axis, and then radiated from the radiation surface 115 to the exterior as parallel rays of light. On the other hand, part of the rays of green light emitted by the LED 120 as parallel rays of light come into and are transmitted through portions of the optical surface 114 where no reflection portions 114a are formed, and then radiated from the radiation surface 115 to the exterior as the parallel rays of light.

According to the first embodiment of the present invention, the rays of red light emitted by the LED chip 111 of the LED 110 are reflected from a plurality of the dotted reflection portions 114a formed on the optical surface 114 while the rays of green light emitted by the LED 120 pass through the portions of the optical surface 114 where no reflection portions 114a are formed, after which the rays of red light and the rays of green light are respectively radiated from the radiation surface 115, with the equal luminous intensity distributions. Each of the dotted reflection portions 114a formed on the optical surface 114 has a micro-size, so that the rays of red light emitted by the LED chip 111 of the LED 110 and the rays of green light emitted by the LED chip of the LED 120 can be exteriorly emitted along approximately the same optical path from respective positions of the radiation surface 115 of the LED 110. In this way, there can be obtained the rays of color-mixed light having a high frontal luminance being sufficient to enable the visual observation even from the portion near thereto. Moreover, there can be obtained the rays of color-mixed light in which the illuminating distribution of light with each luminous wavelength is made constant independently of distance, and which have a high radiation intensity sufficient to be illuminated to a portion with a long distance. The device in this embodiment is suitable for displays, sensors and the like. The area ratio between the optical surface 114 and the reflection portions 114a formed on the optical surface 114 may be determined according to the output of the LED chip and the application. For example, in the case where the luminous flux of red light emitted by the LED chip is identical to that of green light emitted by the other LED chip, the mixing ratio of the rays of red light emitted by the LED 110 to the rays of green light emitted by the LED 120 can be set at 1:1 by making the area of the reflection portions 114a formed on the optical surface 114 be about half that of the optical surface 114. In this case, the exterior radiation efficiency of the radiated rays of light with each color emitted by each LED chip becomes about 50% relative to all the rays of light emitted by the LED chip. However, since rays of light with respective colors can be mixed without any light diffusible material, there can be effectively obtained rays of color-mixed light having a extremely high luminance as compared with the conventional device.

The coloring of rays of light emitted by the multi-layer type light emitting device 100 can be continuously changed from red to green by controlling currents applied to the LED chip 111 of the LED 110 and the LED chip of the LED 120.

Since a space between the LEDs 110, 120 is filled with the light transmissible material 140, it can be prevented that, of the rays of light emitted by the LED 120, ones coming into the portions of the optical surface 114 where no reflection portions 114a are formed are refracted at the interface of the optical surface 114 and radiated in the ineffective directions, and that they are reflected from the interface of the optical surface 114 and reduced in the transmissivity.

In the first embodiment, a plurality of the dotted reflection portions 114a are used as the optical surface of the LED 110; however, the present invention is not limited thereto. The optical surface of the LED 110 is only required to reflect rays of light emitted by the LED chip 111 and transmit rays of light coming from the rear side, and therefore, various modifications are possible.

For example, the optical surface may be obtained by partially forming reflection portions with a mottled, meshed or radial pattern on a transmission surface. A half-mirror composed of a light semi-transmissible thin film reflection surface may be used as the optical surface, which is prepared by controlling the deposited amount when the convex surface of the light transmissible material 113 is subjected to a mirror-surface treatment by metal deposition or the like of Ag, Al or the like. In this case, part of the rays of light emitted by the LED chip 111 are reflected from the half-mirror and radiated from the radiation surface 115; while part of rays of light emitted by the LED 120 is transmitted through the half-mirror and are radiated from the radiation surface 115, which exhibits the same function and effect as those in this embodiment. Moreover, the dotted reflection portions formed on the optical surface 114 may be used as a half-mirror, and portions of the optical surface 114 where no reflection portions are formed may be used as a half-mirror.

Figure 5:
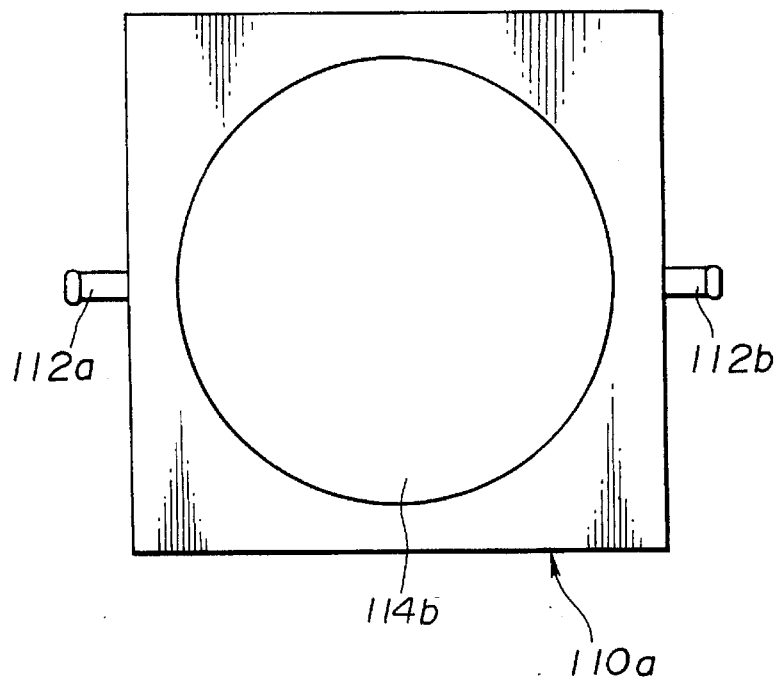
FIG. 5 is a view, equivalent to FIG. 4, for illustrating a modification of the LED used in the multi-layer type light emitting device as the first embodiment.

A dichroic mirror reflecting only rays of light with the wavelength range of red color and transmitting rays of light with the other wavelength range may be formed by alternately layering thin films having different refractive indexes on the convex surface of the light transmissible material 113, which is used, for example, as the optical surface 114a of the LED 110a shown in FIG. 5. In this case, the whole luminous flux of red light emitted by the LED chip 111 is almost reflected by the dichroic mirror and radiated to the exterior, while the whole luminous flux of green light emitted by the LED 120 almost transmit the dichroic mirror and is radiated to the exterior, thus exhibiting the same function and effect as those in this embodiment. Various materials are presently used for a multi-layer thin film forming the dichroic mirror, which are represented by $TiO_2$ and $SiO_2$.

As the optical surface, there may be also used a hologram reflecting only rays of light with a specified wavelength range and transmitting rays of light with the other wavelength ranges. Moreover, since the hologram is able to transmit or reflect rays of light depending on the incident direction thereof, the optical surface may be obtained using the property of the hologram reflecting rays of light from the upper side and transmitting rays of light from the lower side. Such modifications can be similarly applied in the following embodiments.

In the first embodiment, the optical surface of the LED 110 is formed in a revolving parabolic surface focussed on the LED chip 111; however, the present invention is not limited thereto. The optical surface is only required to be formed in a concave surface shape.

Moreover, in the first embodiment, the interior of the case 130 is filled with the light transmissible material 140; however, the present invention is not limited thereto, and may include various modifications.

Figure 6:
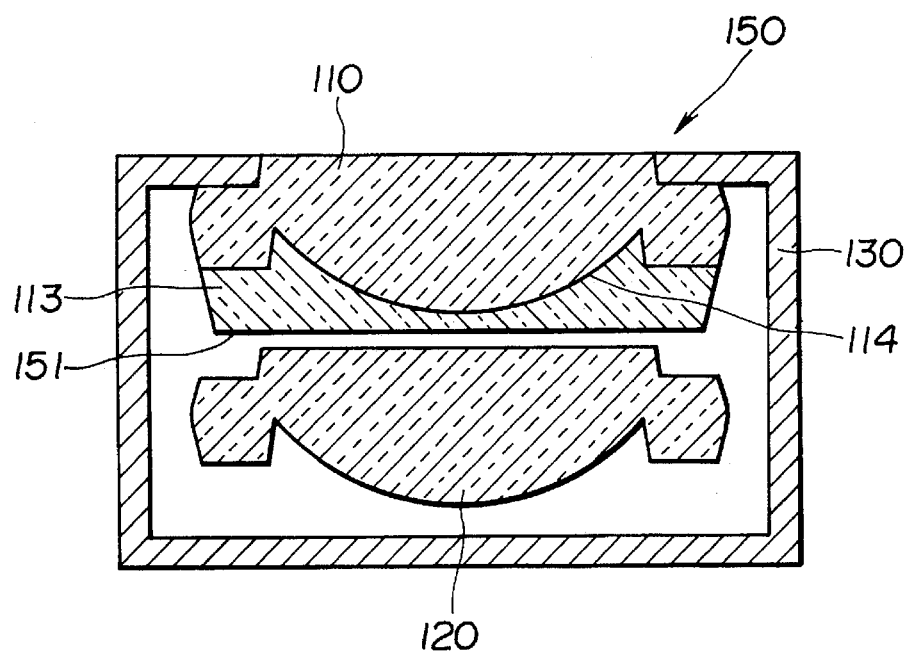
FIG. 6 is a view, equivalent to FIG. 2, of a multi-layer type light emitting device as a modification of the first embodiment of the present invention.

For example, only an optical path between the LEDs 110, 120 may be filled with the light transmissible material 140. Moreover, in the case where an optical system of the multi-layer type light emitting device 100 is designed in consideration of the interfacial refraction of rays of light coming into the optical surface 114, for example, in the case where an optical system such as a lens is disposed between the LEDs 110, 120 and the incident angle of rays of light coming into the optical surface 114 is adjusted, the interior of the case 130 may not be filled with the light transmissible material 140. For example, as shown by a multi-layer type light emitting device 150 in FIG. 6, in the case where an incident surface 151 is provided on the back surface side of the optical surface 114 of the LED 110 such that rays of light emitted by the LED 120 come therein approximately at right angles and a space between the optical surface 114 of the LED 110 and the incident surface 151 is filled with the light transmissible material 113, the rays of light emitted by the LED 120 is allowed to effectively come in the incident surface 151 and to transmit the optical surface 114 without any interfacial refraction.

In the first embodiment, the so-called reflection-type LED 120 is used as the rearmost LED; however, the present invention is not limited thereto, and may include various modifications.

Figure 7:
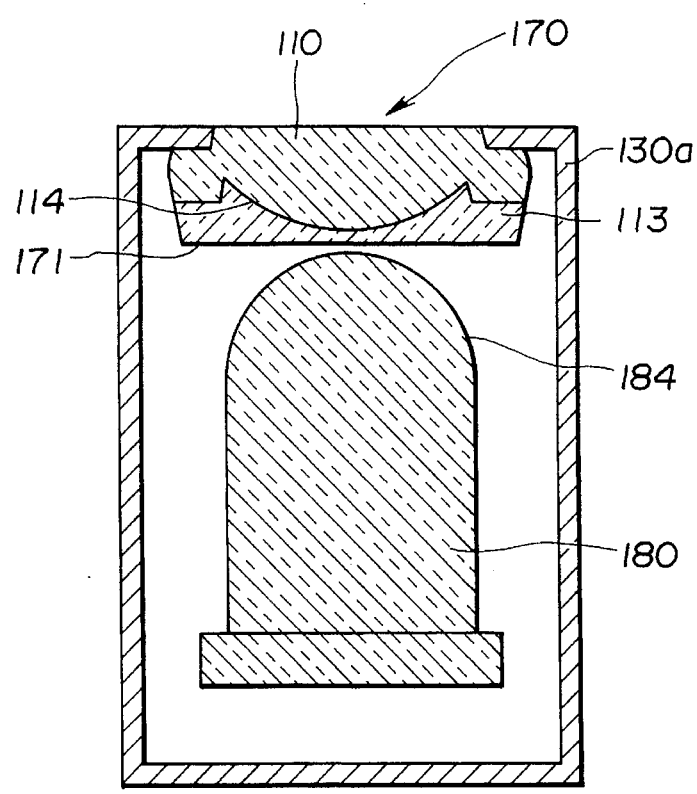
FIG. 7 is a view, equivalent to FIG. 2, of a multi-layer type light emitting device as another modification of the first embodiment of the present invention.
Figure 8:
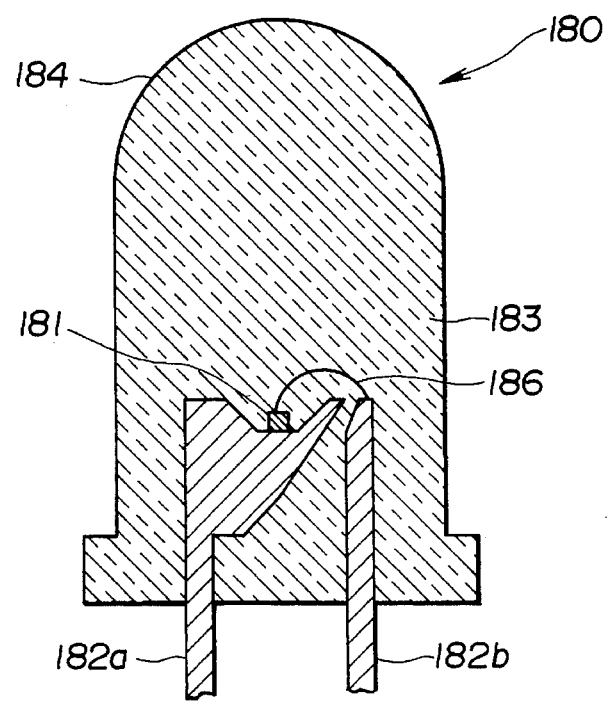
FIG. 8 is a view showing a lens-type LED used in the multi-layer type light emitting device as another modification.

For example, as shown by a multi-layer type light emitting device 170 in FIG. 7, a so-called lens-type LED 180 may be used. As shown in FIG. 8, the lens-type LED 180 has an LED chip 181 emitting rays of green light; lead frames 182a, 182b for supplying a power to the LED chip 181; and a light transmissible material 183. The LED chip 181 is mounted at the leading edge portion of the lead frame 182a, and is electrically connected to the lead frame 182b by means of a wire 186. The LED chip 181, the leading edge portions of the lead frames 182a, 182b, and the wire 186 are integrally sealed by means of the light transmissible material 183. A convex surface-like lens surface 184 is formed on the surface of the light transmissible material 183 on the light emitting surface side of the LED chip 181.

In the lens-type LED 180 having the above construction, rays of light emitted by the LED chip 181 are collected depending on a difference in the refractive index at the interface of the lens surface 184, and are radiated from the lens surface 184 to the exterior as the parallel rays of light. Accordingly, when the interior of a case 130a is filled with the same light transmissible material as that of the lens-type LED 180, the rays of light emitted by the LED chip 181 cannot be collected at the interface of the lens surface 184. For this reason, the interior of the case 130a must not be filled with the same light transmissible material as that of the lens-type LED 180. Thus, as shown in FIG. 7, in the multi-layer type light emitting device 170, an incident surface 171 is provided on the back surface side of the optical surface 114 of the LED 110 such that rays of light emitted by the lens-type LED 180 comes therein approximately at right angles, and a space between the optical surface 114 of the LED 110 and the incident surface 171 is filled with the light transmissible material 113. This prevents that the rays of light emitted by the lens-type LED 180 are refracted in the ineffective directions when they transmit the optical surface 114. In addition, such a modification may be applied to the following embodiments.

A second embodiment of the present invention will be described below with reference to FIG. 9. In addition, the schematic front view of a multi-layer type light emitting device in the second embodiment is the same as that of the first embodiment, and accordingly it is omitted. In this embodiment, parts having the same functions as those of the multi-layer type light emitting device 100 in the first embodiment are indicated at the same or corresponding characters, and the detail explanation thereof is omitted.

Figure 9:
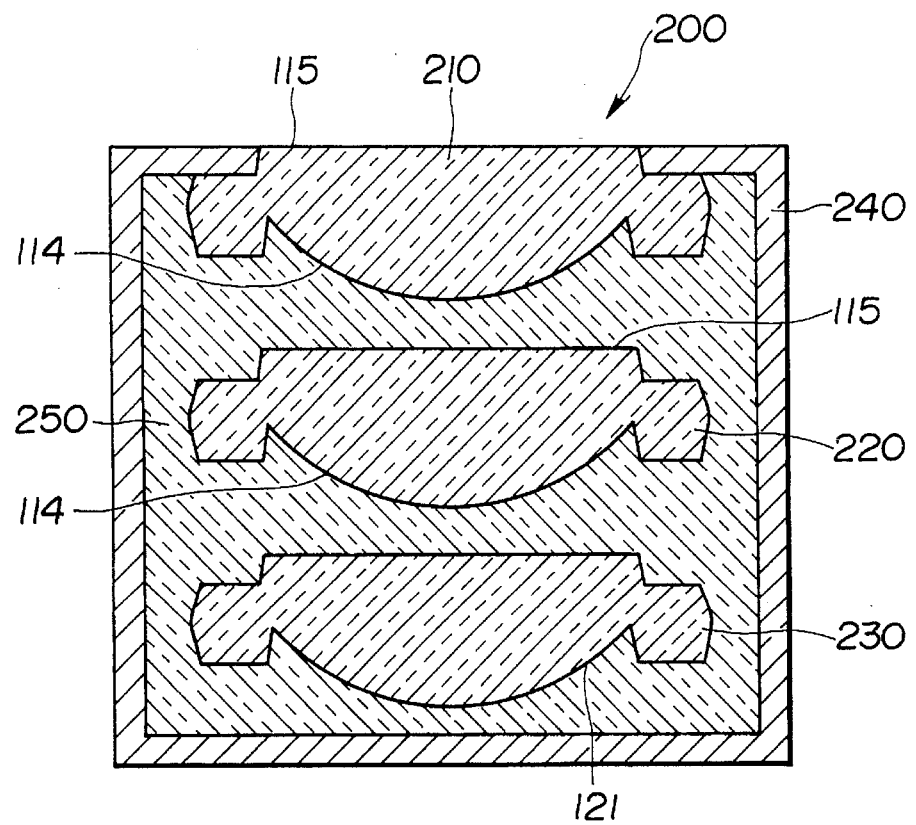
FIG. 9 is a view, equivalent to FIG. 2, of a multi-layer type light emitting device as the second embodiment of the present invention.

As shown in FIG. 9, a multi-layer type light emitting device 200 as the second embodiment of the present invention has an LED 210; an LED 220 disposed on the rear stage of the LED 210,; a rearmost LED 230 disposed at the rear stage of the LED 220; a case 240 containing the LEDs 210, 220, 230; and a light transmissible material 250 filling the interior of the case 240.

The LED 210 has the same construction as that of the LED 110 used in the first embodiment, except that the LED chip 111 emitting rays of red light is replaced with an LED chip (not shown) emitting rays of green light.

The LED 220 has the same construction as that of the LED 110 used in the first embodiment, except that the LED chip 111 emitting rays of red light is replaced with an LED chip (not shown) emitting rays of blue light.

The rearmost LED 230 has the same construction as that of the rearmost LED 120 used in the first embodiment, except that the LED chip emitting rays of green light is replaced with an LED chip emitting rays of red light.

In the multi-layer type light emitting device 200 having the above construction, part of rays of green light emitted by the LED chip of the LED 210 are reflected from a plurality of dotted reflection portions 114a formed on an optical surface 114 of the LED 210 in the direction approximately parallel to the center axis, and radiated from the radiation surface 115 of the LED 210 to the exterior as the parallel rays of light. On the other hand, part of the rays of blue light emitted by the LED chip of the LED 220 are reflected from a plurality of the dotted reflection portions 114a formed on the optical surface 114 of the LED 220 in the direction approximately parallel to the center axis, and radiated from the radiation surface 115 of the LED 220, after which they come into portions of the optical surface 114 of the LED 210 where no reflection portions 114a are formed, and are radiated from the radiation surface 115 of the LED 210 to the exterior as the parallel rays of light. Moreover, part of the rays of red light emitted as the parallel rays of light by the rearmost LED 230 come into portions of the optical surface 114 of the LED 220 where no reflection portions 114a are formed, and are radiated from the radiation surface 115 of the LED 220, after which they come into the portions of the optical surface 114 of the LED 210 where no reflection portions 114a are formed, and are radiated from the radiation surface 115 of the LED 210 to the exterior as the parallel rays of light.

According to the second embodiment, the rays of green light emitted by the LED chip of the LED 210, the rays of blue light emitted by the LED chip of the LED 220, and the rays of red light emitted by the LED chip of the LED 230 are effectively mixed and radiated from the radiation surface 115 of the LED 210 to the exterior. In particular, the rays of red light and the rays of blue light, which are difficult to be physiologically visually observed as being mixed, can be sufficiently mixed. Moreover, the rays of light with all colors can be radiated by controlling respective currents applied to the LED chips of the LEDs 210, 220 and 230. The other effects are the same as those in the first embodiment.

In the second embodiment, the interior of the case 240 is filled with the light transmissible material 250; however, the present invention is not limited thereto, and may include modifications similar to those in the first embodiment.

A third embodiment of the present invention will be described below with reference to FIGS. 10 to 15. In FIG. 11, LED chips, leads and the like constituting an LED are omitted.

Figure 10:
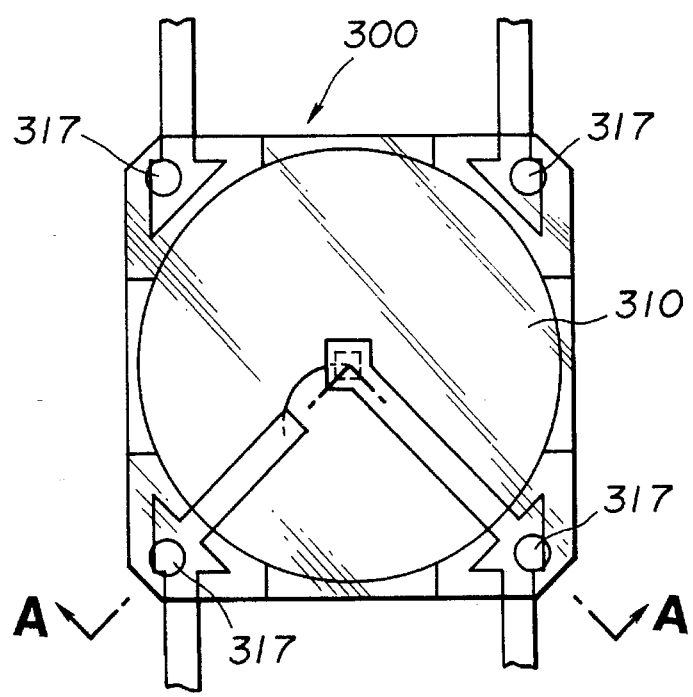
FIG. 10 is a schematic front view of a multi-layer type light emitting device as a third embodiment of the present invention.
Figure 11:
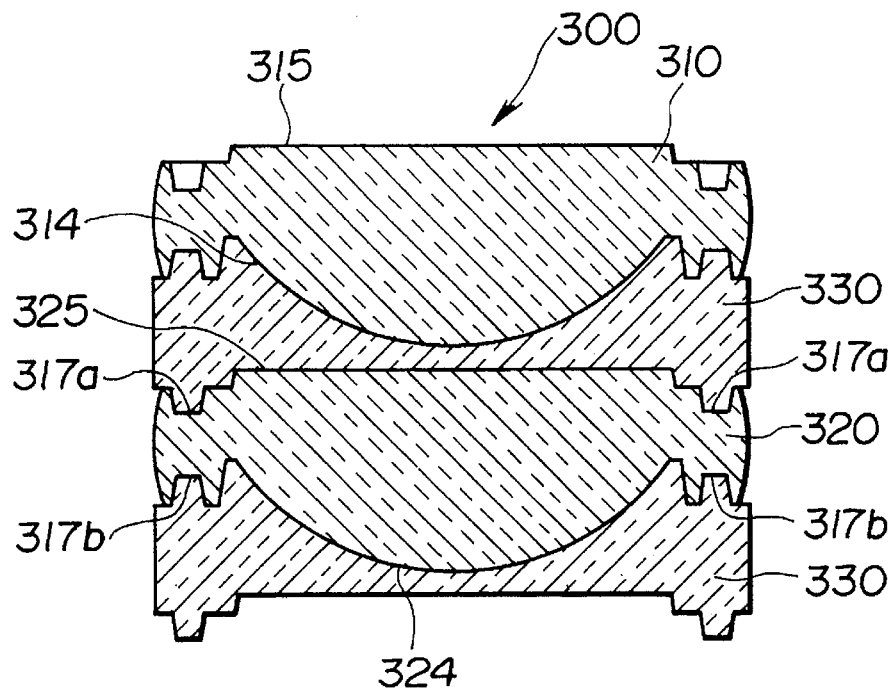
FIG. 11 is a schematic sectional view taken along line A—A of the multi-layer type light emitting device shown in FIG. 10.

As shown in FIGS. 10 and 11, a multi-layer type light emitting device 300 as the third embodiment has an LED 310; a rearmost LED 320 disposed on the rear stage of the LED 310; a spacer 330 disposed between the LEDs 310, 320; and a spacer 330 disposed on the rear stage of the LED 320.

Figure 12:
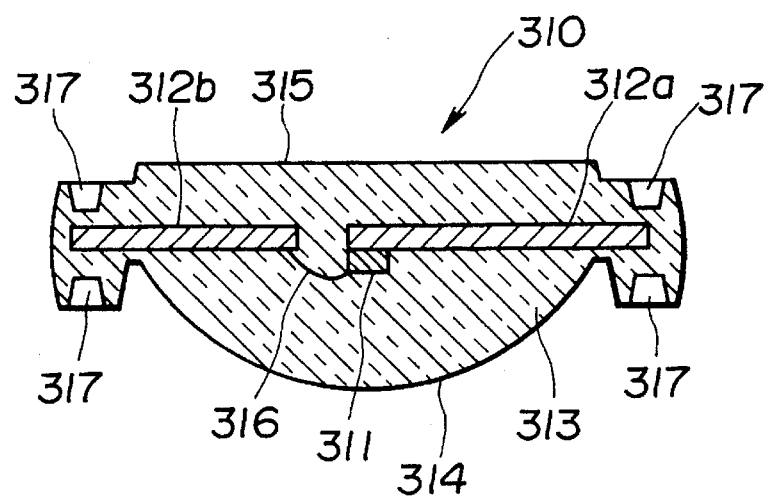
FIG. 12 is a view of an LED used in the multi-layer type light emitting device as the third embodiment.
Figure 13:
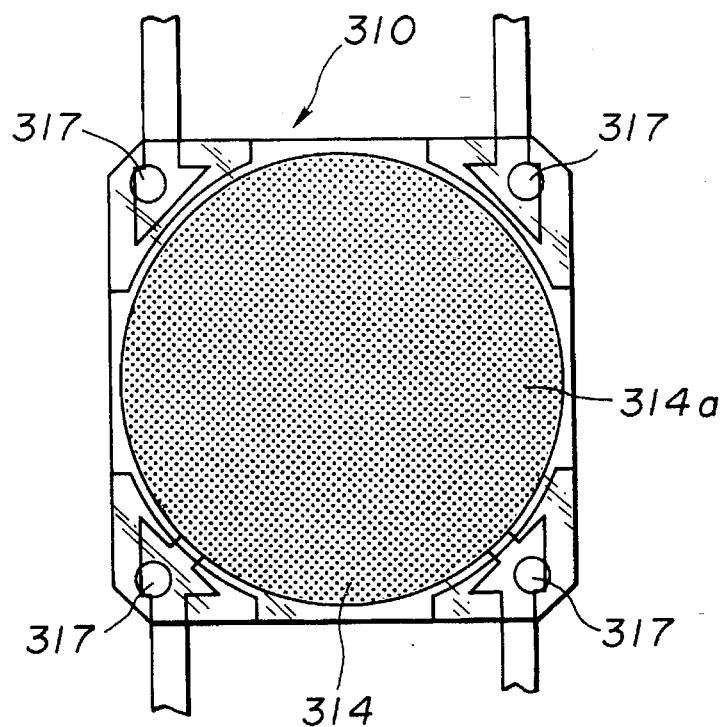
FIG. 13 is a schematic bottom view of the LED shown in FIG. 12 (seen from the optical surface side)

As shown in FIG. 12, the LED 310 has an LED chip 311 emitting rays of red light; lead frames 312a, 312b for supplying a power to the LED chip 311; a light transmissible material 313; an optical surface 314 as a rear surface provided to face to the emitting surface of the LED chip 311; and a radiation surface 315 as a front surface provided on the back surface side of the LED chip 311. The LED chip 311 is mounted at the leading edge portion of the lead frame 312a, and is electrically connected to the lead frame 312b by means of a wire 316. The LED chip 311, the leading edge portions of the lead frames 312a, 312b, and the wire 316 are integrally sealed by the light transmissible material 313. As shown in FIG. 13, the optical surface 314 is formed with a plurality of dotted reflection portions 314a by a method wherein the convex surface of the light transmissible material 313 is partially subjected to mirror-surface treatment by plating, metal deposition or the like. It is formed in a revolving parabolic surface shape focussed on the LED chip 311. The radiation surface 315 is formed in a flat shape. As shown in FIGS. 10, 12 and 13, recessed portions 317 are formed at four corners of the light transmissible material 313 on the radiation surface 315 side, and at four corners of the light transmissible material 313 on the optical surface 314 side. These are used when the LED 310 is fitted with the spacer 330.

The rearmost LED 320 is different from the LED 310 in that the LED chip 311 emitting rays of red light is replaced with a LED chip (not shown) emitting rays of green light, and that the optical surface 314 formed with a plurality of the dotted reflection portions 314a is replaced with a reflection surface 324 as a rear surface which is formed in a revolving parabolic surface shape focussed on the LED chip. The reflection surface 324 is formed by a method wherein the whole convex surface of the light transmissible material is subjected to mirror-surface treatment by plating, metal deposition or the like. The other structures are the same as those of the LED 310, and accordingly, in the LED 320, parts having the same functions as those of the LED 310 are indicated at the same or corresponding characters and the detail explanation thereof is omitted.

Figure 14:
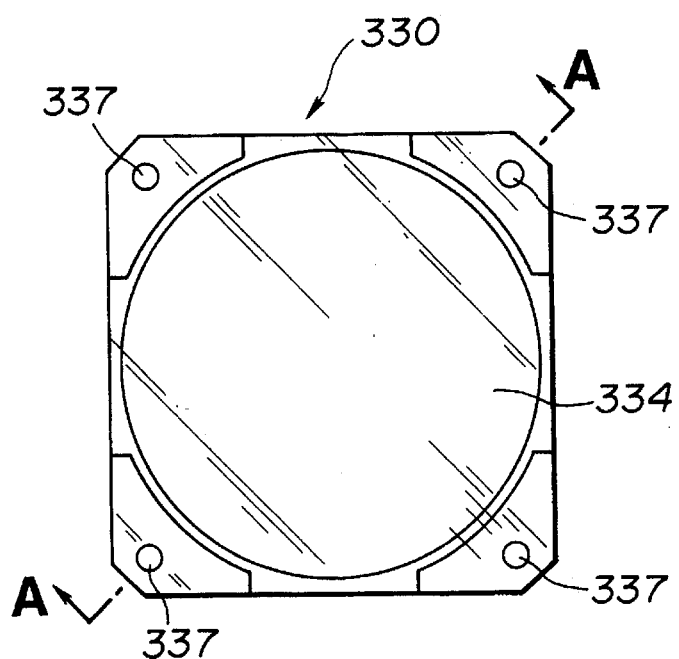
FIG. 14 is a schematic front view of a spacer used in the multi-layer type light emitting device as the third embodiment.
Figure 15:
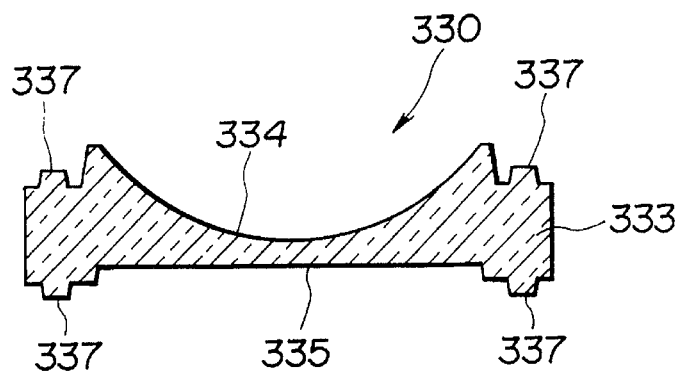
FIG. 15 is a schematic sectional view taken along line A—A of the spacer shown in FIG. 14.

As shown in FIGS. 14 and 15, the spacer 330 has a light transmissible material 333, and connection surfaces 334, 335. The light transmissible material 333 has approximately the same refractive index as that of the light transmissible material 313 of the LED 310. This prevents that the rays of light emitted by the LED 320 are refracted from the interface of the optical surface 314 and are radiated in the ineffective directions. The connection surface 334 is formed in a shape complementary to the optical surface 314 of the LED 310 and the reflection surface 324 of the LED 320, that is, in a revolving parabolic surface shape corresponding to the optical surface 314 and the reflection surface 324. The connection surface 334 is closely connected to the optical surface 314 or the reflection surface 324. The connection surface 335 is formed in a shape complementary to the radiation surface 325 of the LED 320, that is, in a flat shape corresponding to the radiation surface 325. As shown in FIGS. 14 and 15, projecting portions 337 are formed at four corners of the light transmissible material 333 on the connection surface 334 side and at four corners of the light transmissible material 333 on the connection surface 335 side. These are used when the spacer 330 is fitted with the LEDs 310, 320.

In the multi-layer type light emitting device 300 having the above construction, part of rays of red light emitted by the LED chip 311 of the LED 310 are reflected from a plurality of the dotted reflection portions 314a (shown by the black portions in FIG. 13) formed on the optical surface 314 in the direction approximately parallel to the center axis, and radiated from the radiation surface 315 to the exterior as the parallel rays of light. The rays of green light emitted by the LED chip of the LED 320 are reflected from the reflection surface 324 in the direction approximately parallel to the center axis, being radiated from the radiation surface 325 as the parallel rays of light, and transmit the spacer 330 disposed between the LEDs 310, 320. Part of the rays of green light after transmitting the spacer 330 come into and transmit portions of the optical surface 314 of the LED 310 where no reflection portions 314a are formed, and radiated from the radiation surface 315 to the exterior as the parallel rays of light.

According to the third embodiment, since the spacer 330 made of the light transmissible material 333 having a refractive index being approximately the same as that of the light transmissible material 313 used for the LED 310 is provided between the LEDs 310, 320, it can be prevented that the rays of green light emitted by the LED 320 are refracted when they transmit the optical surface 314 of the LED 310 and are radiated in the ineffective directions. As compared with the case where the space between the LEDs 310, 320 is filled with a light transmissible material, a process of injecting the light transmissible material is eliminated, thus making easy the fabrication of the multi-layer type light emitting device. The other effects are the same as those in the first embodiment.

Upon connection between the LED 310 and the spacer 330 and between the LED 320 and the spacer 330, it is desirable to interpose adhesive of a light transmissible material having a refractive index being approximately the same as that of the light transmissible material 313 of the LED 310. This eliminates the interfacial reflection of the rays of green light emitted by the LED 320, which is generated when they transmit between the LED 320 and the spacer 330 and between the spacer 330 and the LED 310. However, even when no adhesive is interposed therebetween, the thickness of an air layer formed at the connection portion between the LED and spacer is small because the connection surface of the spacer corresponds to the LED, and accordingly, a large deviation of an optical path due to the interfacial reflection can be prevented. In the case where adhesive is interposed therebetween, it is possible to eliminate the interfacial reflection loss of about 8%, caused by the air layer.

In the third embodiment, the optical surface 314 of the LED 310 is formed in the revolving parabolic surface shape focussed on the LED chip 311; however, the present invention is not limited thereto. The optical surface is only required to be formed in a concave surface shape.

Moreover, in the third embodiment, the optical surface 314 is formed on the surface of the light transmissible material 313 of the LED 310, and the reflection surface is formed on the surface of the light transmissible material of the LED 320; however, the present invention is not limited thereto. The optical surface 314 and the reflection surface 324 may be disposed to face to the light emitting surface of the LED chip. For example, it may be formed on the front surface (on which the connection surface 334 is originally formed) of the spacer 330 disposed on the rear stage of each LED chip. In this case, since any lead for supplying a power is not formed on the spacer differently from the LED, a plurality of spacers can be subjected to mirror-surface treatment once by deposition or the like, as compared with the case where the optical surface is formed on the LED 310 and the reflection surface is formed on the LED 320.

A fourth embodiment of the present invention will be described with reference to FIG. 16. In addition, the schematic front view of a multi-layer type light emitting device in the fourth embodiment is the same as that in the third embodiment, and accordingly it is omitted. In the fourth embodiment, parts having the same functions as those in the multi-layer type light emitting device 300 in the third embodiment are indicated at the same or corresponding characters, and the detail explanation thereof is omitted.

Figure 16:
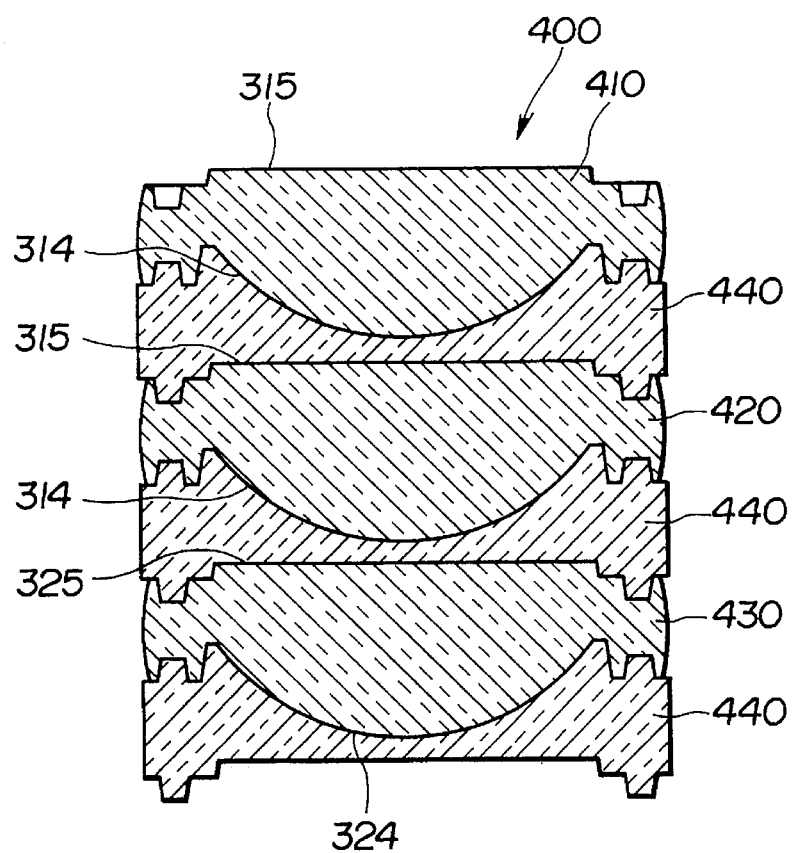
FIG. 16 is a view, equivalent to FIG. 11, of a multi-layer type light emitting device as a fourth embodiment of the present invention.

As shown in FIG. 16, a multi-layer type light emitting device 400 in the fourth embodiment of the present invention has an LED 410; an LED 420 disposed on the rear stage of the LED 410; a rearmost LED 430 disposed on the rear stage of the LED 420; a spacer 440 disposed between the LEDs 410, 420; a spacer 440 disposed between the LEDs 420, 430; and a spacer 440 disposed behind the LED 430.

The LED 410 has the same construction as that of the LED 310 used in the third embodiment, except that the LED chip 311 emitting rays of red light is replaced with an LED chip (not shown) emitting rays of green light.

The LED 420 has the same construction as that of the LED 310 used in the third embodiment, except that the LED chip 311 emitting rays of red light is replaced with an LED chip (not shown) emitting rays of blue light.

The rearmost LED 430 has the same construction as that of the rearmost LED 320 used in the third embodiment, except that the LED chip emitting rays of green light is replaced with an LED chip (not shown) emitting rays of red light.

The spacer has the same construction as that of the spacer 330 used in the third embodiment.

In the multi-layer type light emitting device 400 having the above construction, part of rays of green light emitted by the LED chip of the LED 410 are reflected from a plurality of the dotted reflection portions formed on the optical surface 314 of the LED 410 in the direction approximately parallel to the center axis, and radiated from the radiation surface 315 of the LED 410 to the exterior as the parallel rays of light. Part of rays of blue light emitted by the LED chip of the LED 420 are reflected from a plurality of the dotted reflection portions formed on the optical surface 314 of the LED 420 in the direction approximately parallel to the center axis, being radiated from the radiation surface 315 of the LED 420, and transmit the portions of the optical surface 314 of the LED 410 where no reflection portions are formed, and are radiated from the radiation surface 315 of the LED 410 to the exterior as the parallel rays of light. Part of rays of red light emitted by the LED 430 as parallel rays of light transmit the portions of the optical surface 314 of the LED 420 where no reflection portions are formed, and are radiated from the radiation surface 315 of the LED 420. They transmit the portions of the optical surface 314 of the LED 410 where no reflection portions are formed, and are radiated from the radiation surface 315 of the LED 410 to the exterior as the parallel rays of light.

According to the fourth embodiment, rays of green light emitted by the LED chip of the LED 410, rays of blue light emitted by the LED chip of the LED 420, and rays of red light emitted by the LED chip of the LED 430 can be effectively mixed and radiated to the exterior. Moreover, rays of light with all colors can be radiated by controlling respective currents applied to the LED chips of the LEDs 410, 420, 430. The other effects are the same as those in the third embodiment.

A fifth embodiment of the present invention will be described with reference to FIGS. 17 to 20.

Figure 17:
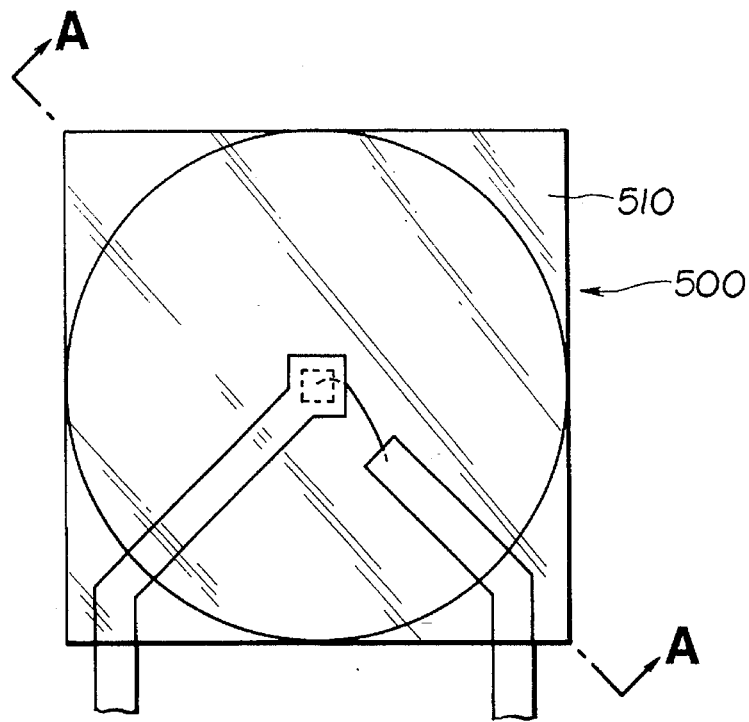
FIG. 17 is a schematic front view of a multi-layer type light emitting device as a fifth embodiment of the present invention.
Figure 18:
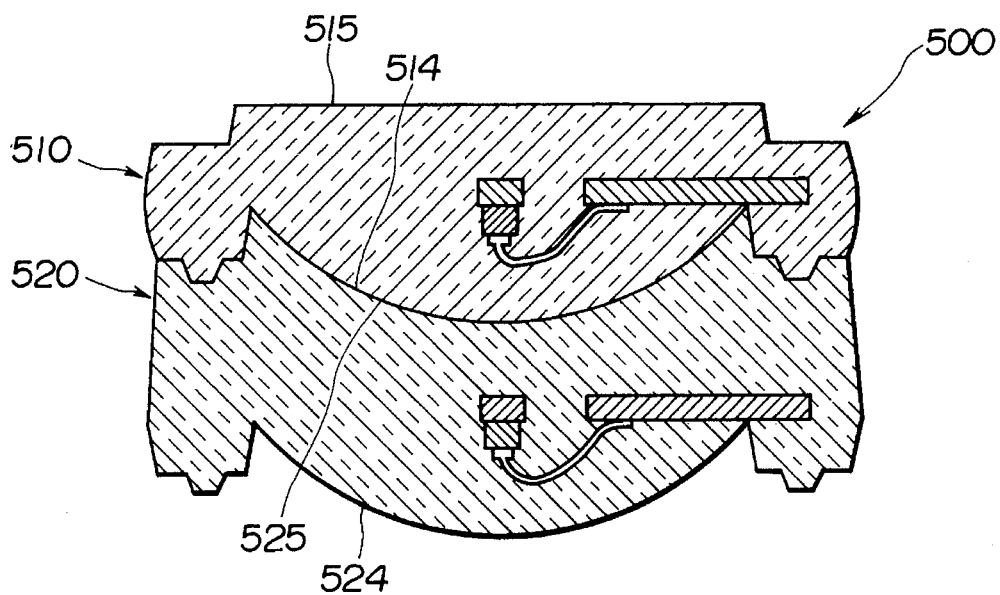
FIG. 18 is a schematic sectional view taken along line A—A of the multi-layer type light emitting device shown in FIG. 17.

As shown in FIGS. 17 and 18, a multi-layer type light emitting device 500 as the fifth embodiment has an LED 510, and a rearmost LED 520 disposed on the rear stage of the LED 510.

Figure 19:
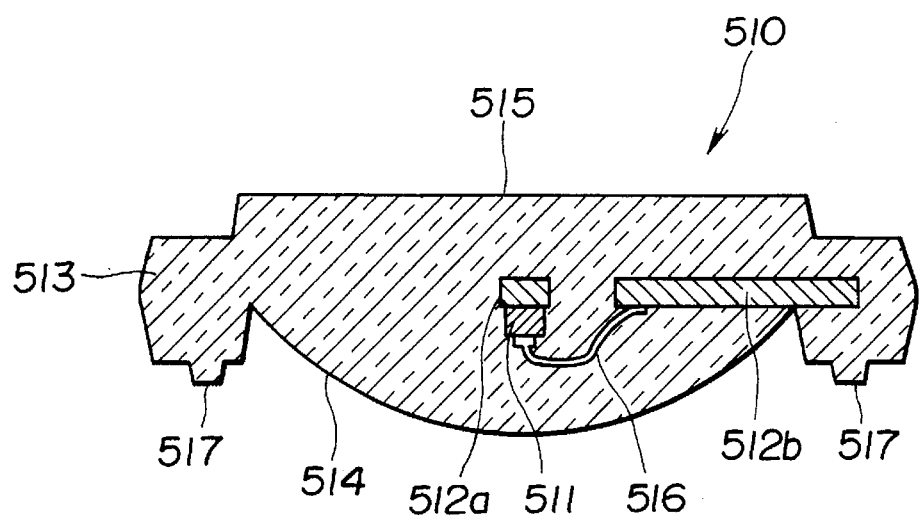
FIG. 19 is a view showing an LED used in the multi-layer type light emitting device as the fifth embodiment.

As shown in FIG. 19, the LED 510 has an LED chip 511 emitting rays of red light; lead frames 512a, 512b for supplying a power to the LED chip 511; a light transmissible material 513; an optical surface 514 as a rear surface which is provided to face to the light emitting surface of the LED chip 511; and a radiation surface 515 provided on the back surface side of the LED chip 511. The LED chip 511 is mounted at the leading edge portion of the lead frame 512a, and is electrically connected to the lead frame 512b by way of a wire 516. The LED chip 511, the leading edge portions of the lead frames 512a, 512b, and the wire 516 are integrally sealed by the light transmissible material 513. The optical surface 514 is formed with a plurality of dotted reflection portions by a method wherein the convex surface of the light transmissible material 513 is partially subjected to mirror-surface treatment by plating, metal deposition or the like. It is formed in a revolving parabolic surface shape focussed on the LED chip 511. The radiation surface 515 is formed in a flat shape. Projecting portions 517 are formed at four corners of the light transmissible material 513 on the optical surface 514 side. These are used when the LED 510 is fitted with the LED 520.

Figure 20:
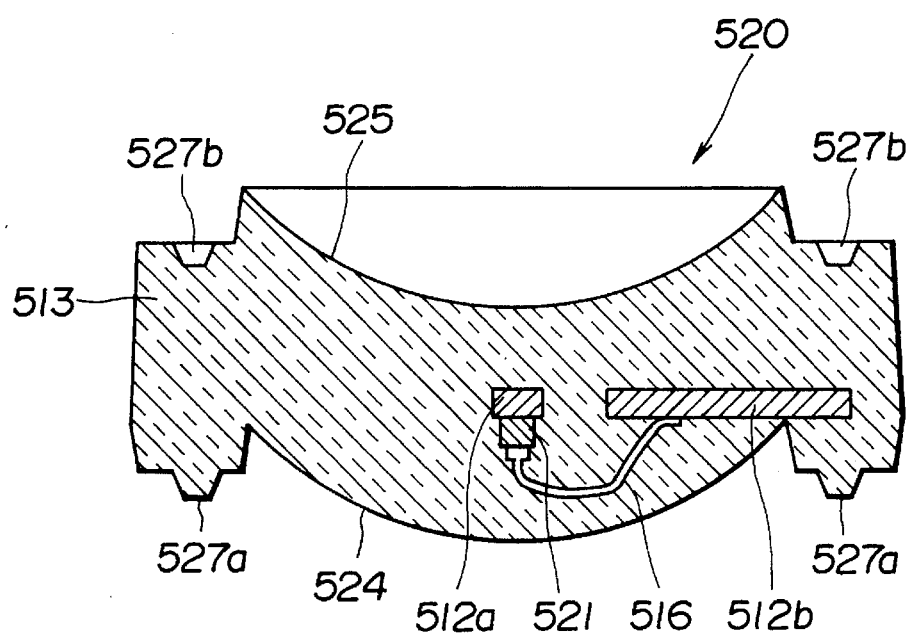
FIG. 20 is a view showing an LED provided on the rearmost stage used in the multi-layer type light emitting device as the fifth embodiment.

As shown in FIG. 20, the rearmost LED 520 has an LED chip 521 emitting rays of green light; lead frames 512a, 512b for supplying a power to the LED chip 521; a light transmissible material 513; a reflection surface 524 provided to face to the light emitting surface of the LED chip 521; and a radiation surface 525 as a front surface which is provided on the back surface side of the LED chip 521. In the LED 520, parts having the same functions as those in the LED 510 are indicated at the same or corresponding characters, and the detail explanation thereof is omitted.

The reflection surface 524 is formed by a method wherein the whole convex surface of the light transmissible material 513 is subjected to mirror-surface treatment by plating, metal deposition or the like. It is formed in a revolving parabolic surface shape focussed on the LED chip 521. The radiation surface 525 is formed in a shape complementary to the optical surface 514 of the LED 510, that is, in a revolving parabolic surface shape corresponding to the optical surface 514. It is closely connected to the optical surface 514 of the LED 510. Projecting portions 527a are formed at four corners of the light transmissible material 513 on the reflection surface 524 side, and recessed portions 527b are formed at four corners of the radiation surface 525 side. These are used when the LEDs are fitted with each other.

In the multi-layer type light emitting device 500 having the above construction, part of rays of red light emitted by the LED chip 511 of the LED 510 are reflected from a plurality of the dotted reflection portions formed on the optical surface 514 in the direction approximately parallel to the center axis, and then radiated from the radiation surface 515 to the exterior as the parallel rays of light. The rays of green light emitted by the LED chip 521 of the LED 520 are reflected from the reflection surface 524 in the direction approximately parallel to the center axis, being radiated from the radiation surface 525, and come into the optical surface 514 of the LED 510. Of the rays of light coming into the optical surface 514 of the LED 510, ones coming into portions of the optical surface 514 where no reflection portions are formed transmit the optical surface 514 and are radiated from the radiation surface 515 to the exterior.

According to the fifth embodiment, the radiation surface 525 of the LED 520 is formed in a shape complementary to that of the optical surface 514 of the LED 510 and it is closely connected to the optical surface 514 of the LED 510. This prevents that the rays of green light emitted by the LED 520 are changed in the radiation direction and radiated in the ineffective directions after transmitting the radiation surface 525 and the optical surface 514 of the LED 510. As compared with the case where a space between the LEDs 510, 520 is filled with the light transmissible material, the process of injecting the light transmissible material can be eliminated, thus making easy the fabrication of the multi-layer type light emitting device. The spacer can be also eliminated, to thereby improve workability. The other effects are the same as those in the first embodiment.

When the optical surface 514 of the LED 510 is connected to the radiation surface 525 of the LED 520, it is desirable to interpose adhesive of a light transmissible material having a refractive index being approximately the same as that of the light transmissible material 513 of the LEDs 510, 520 therebetween. This eliminates the interfacial reflection of the rays of green light emitted by the LED 520, which is generated when they transmit between the radiation surface 525 and the optical surface 514. However, even when no adhesive is interposed therebetween, since the shape of the connection surface of the optical surface 514 corresponds to that of the radiation surface 525, the thickness of an air layer formed between the optical surface 514 and the radiation surface 525 is small, thereby preventing the generation of a large deviation in the optical path due to the interfacial reflection. In addition, in the case where adhesive is interposed therebetween, it becomes possible to eliminate the interfacial reflection loss of about 8% due to the air layer.

In the fifth embodiment, the optical surface 514 is formed on the surface of the light transmissible material 513 of the LED 510; however, the present invention is not limited thereto. The optical surface may be disposed to face to the light emitting surface of the LED chip. For example, it may be formed on the front surface (on which the radiation surface 525 is originally formed) of the rear stage LED 520.

A sixth embodiment of the present invention will be described with reference to FIG. 21. In addition, the schematic front view of a multi-layer type light emitting device in this embodiment is the same as that in the fifth embodiment, and accordingly it is omitted. In the sixth embodiment, parts having the same functions as those in the multi-layer type light emitting device 500 in the fifth embodiment are indicated at the same or corresponding characters, and the detail explanation thereof is omitted.

Figure 21:
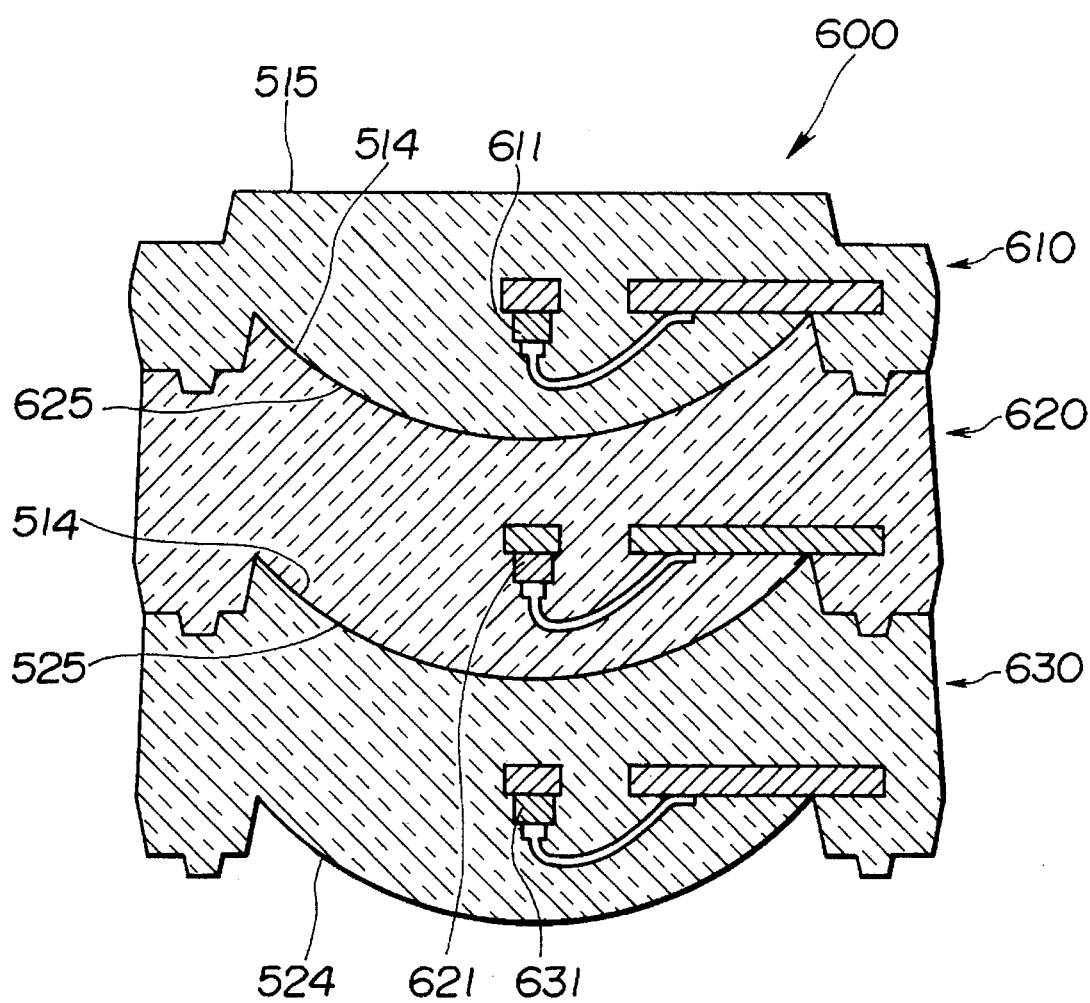
FIG. 21 is a view, equivalent to FIG. 18, of a multi-layer type light emitting device as a sixth embodiment of the present invention.

As shown in FIG. 21, a multi-layer type light emitting device 600 as the sixth embodiment of the present invention has an LED 610, an LED 620 disposed on the rear stage of the LED 610, and a rearmost LED 630 disposed on the rear stage of the LED 620.

The LED 610 has the same construction as that of the LED 510 used in the fifth embodiment, except that the LED chip 511 emitting rays of red light is replaced with an LED chip 611 emitting rays of green light.

The LED 620 has the same construction as that of the LED chip 510 used in the fifth embodiment, except that the LED chip 511 emitting rays of red light is replaced with an LED chip 621 emitting rays of blue light, and that the flat radiation surface 515 is replaced with a radiation surface 625 formed in a shape complementary to the optical surface 514 of the LED 610.

The rearmost LED 630 has the same construction as that of the rearmost LED 520 used in the fifth embodiment, except that the LED chip 521 emitting rays of green light is replaced with an LED chip 631 emitting rays of red light.

According to the sixth embodiment, rays of light with three colors, that is, green, blue and red are exteriorly radiated from respective positions of the radiation surface 515 of the LED 610 along the same optical path. As a result, as observed from the front side, that is, from the front side of the optical axis of the multi-layer type light emitting device 600, the rays of green light, blue light and red light can be visually observed to be sufficiently mixed even from a portion near thereto. The other effects are the same as those in the fifth embodiment.

Figure 22:
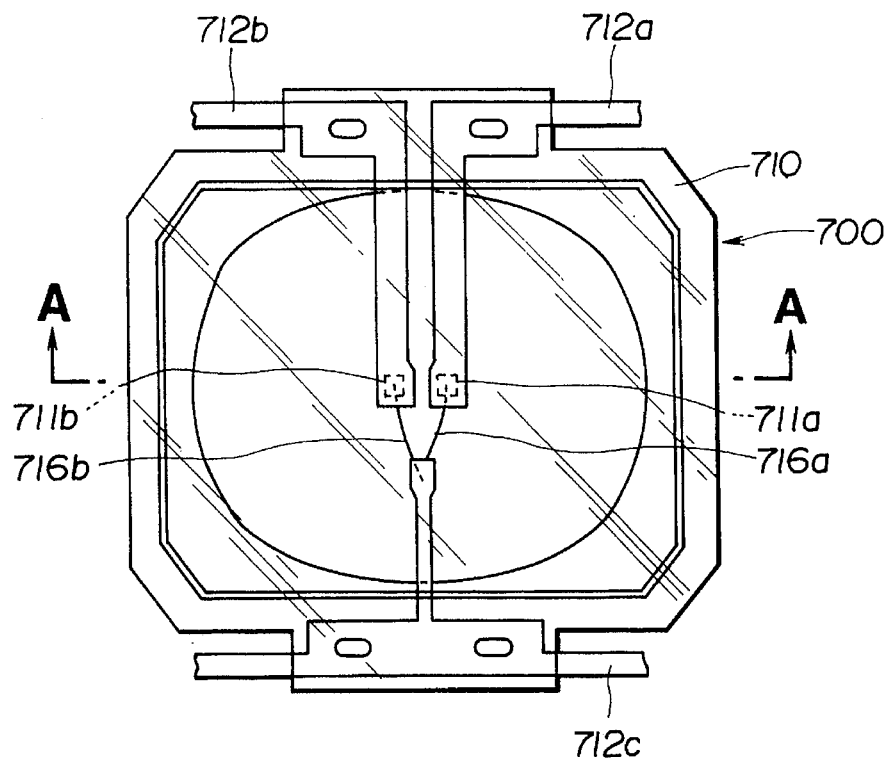
FIG. 22 is a schematic front view of a multi-layer type light emitting device as a seventh embodiment.
Figure 23:
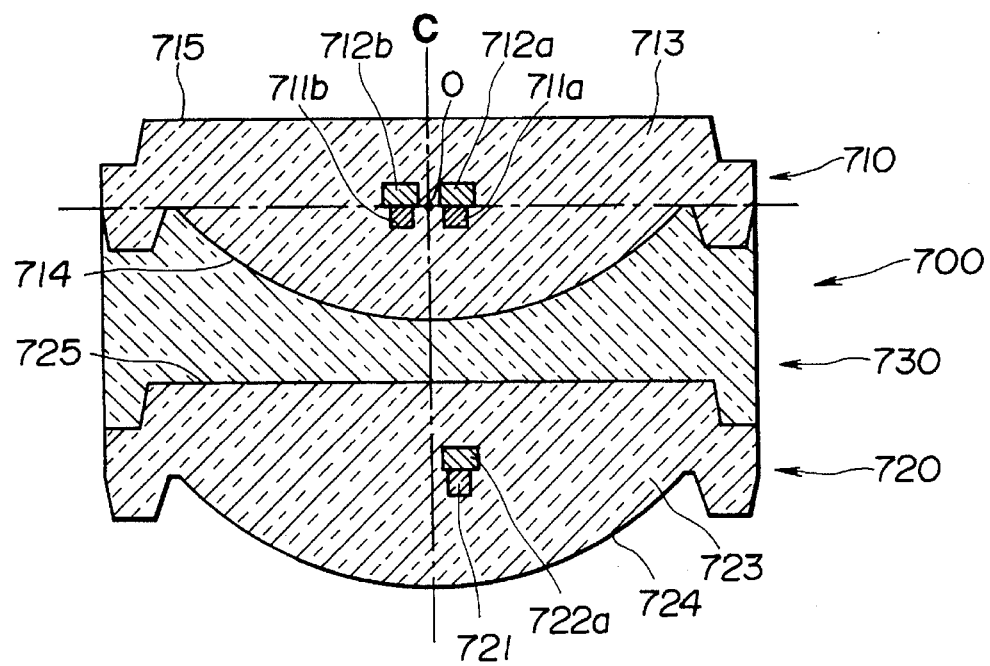
FIG. 23 is a schematic sectional view taken along line A—A of the multi-layer type light emitting device shown in FIG. 22.

A seventh embodiment of the present invention will be described below with reference to FIGS. 22 to 30. As shown in FIGS. 22 and 23, a multi-layer type light emitting device 700 as the seventh embodiment of the present invention includes an LED 710; a rearmost LED 720 disposed on the rear stage of the LED 710 such that the center axis thereof corresponds to the center axis C of the LED 710; and a spacer 730 disposed between the LEDs 710, 720.

Figure 24:
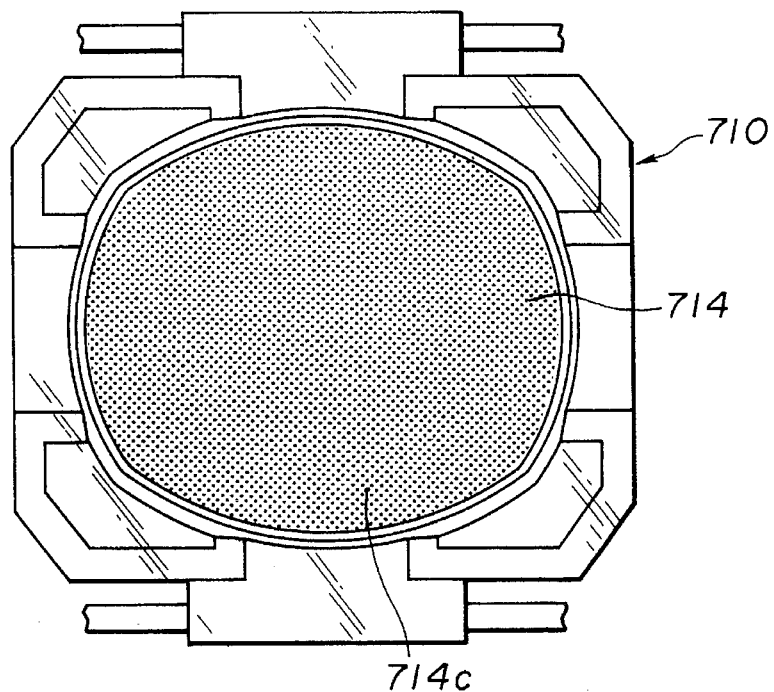
FIG. 24 is a schematic bottom view of an LED used in the multi-layer type light emitting device as the seventh embodiment (seen from the optical surface side)

As shown in FIGS. 22 to 24, the LED 710 includes an LED chip 711a emitting rays of red light; an LED chip 711b emitting rays of green light ray; lead frames 712a, 712b, 712c; a light transmissible material 713; an optical surface 714 provided to face to the light emitting surfaces of the LED chips 711a, 711b; a radiation surface 715 provided on the back surface of the LED chips 711a, 711b; and wires 716a, 716b. As shown in FIG. 23, the LED chips 711a, 711b are mounted at positions approximately symmetric to each other in the horizontal direction relative to the center axis C. The LED chip 711a is mounted at the leading edge portion of the lead frame 712a, and is electrically connected to the lead frame 712c by means of the wire 716a. The LED chip 711b is mounted at the leading edge portion of the lead frame 712b, and is electrically connected to the lead frame 712c by means of the wire 716b. The light transmissible material 713 integrally seals the LED chips 711a, 711b, and the leading edge portions of the lead frames 712a, 712b, 712c and the wires 716a, 716b. As shown in FIG. 23, the radiation surface 715 is flatly formed on the surface of the light transmissible material 713.

Figure 25:
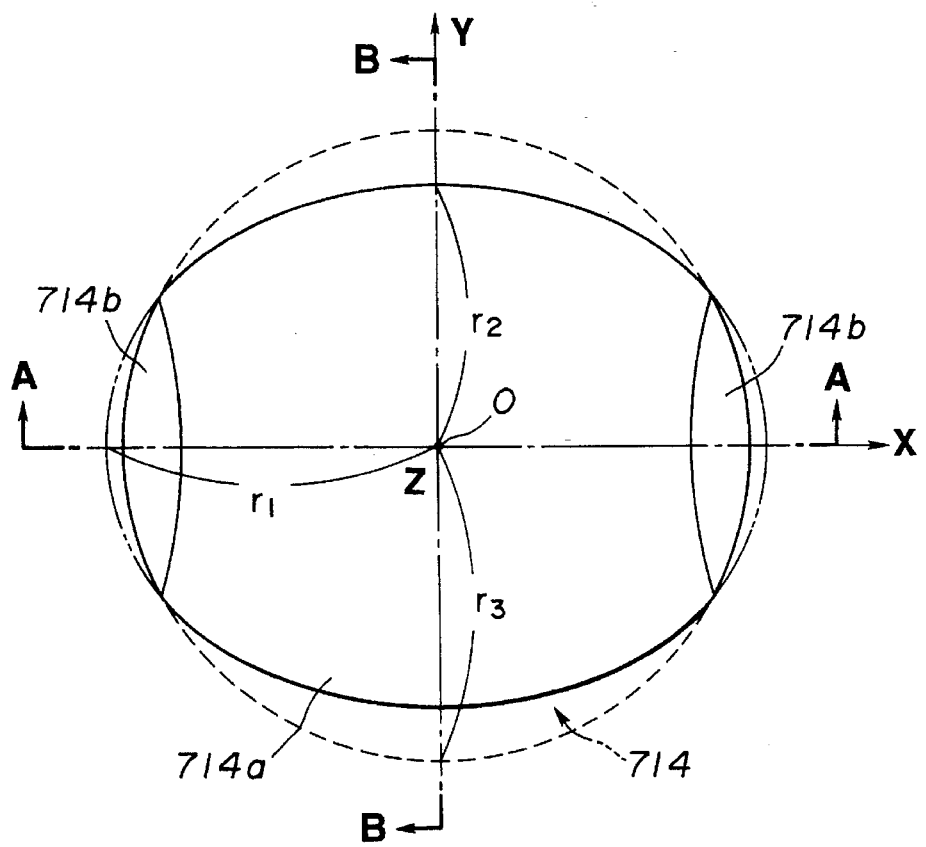
FIG. 25 is a schematic front view of the optical surface of an LED used in the multi-layer type light emitting device as the seventh embodiment.
Figure 26:
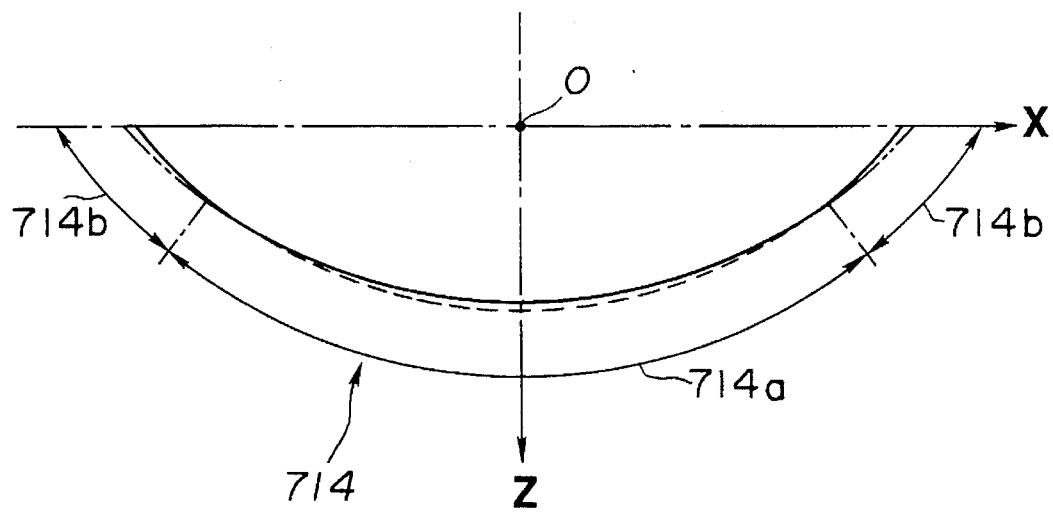
FIG. 26 is a schematic sectional view taken along line A—A of the optical surface shown in FIG. 25.
Figure 27:
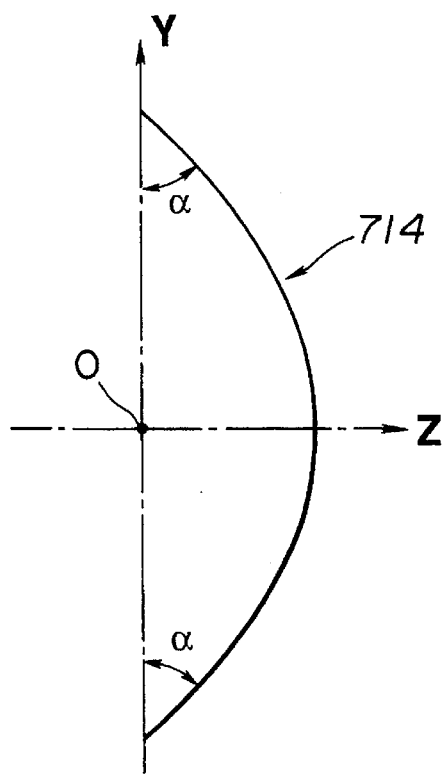
FIG. 27 is a schematic sectional view taken along line B—B of the optical surface shown in FIG. 25.
Figure 28:
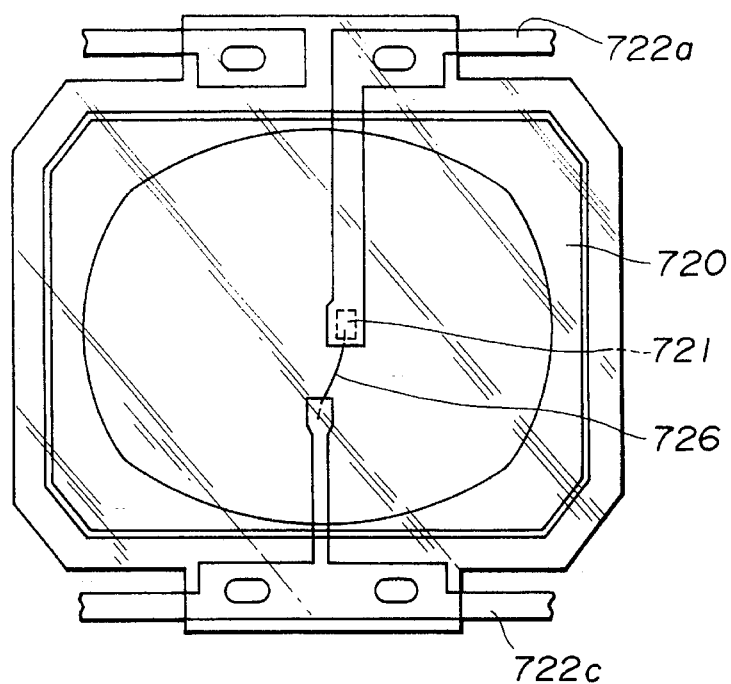
FIG. 28 is a schematic front view of an LED provided on the rearmost stage used in the multi-layer type light emitting device as the seventh embodiment.

As shown in FIGS. 23 and 24, the optical surface 714 is formed with a plurality of dotted reflection portions 714c by a method wherein the convex surface of the light transmissible material 713 is partially subjected to mirror-surface treatment by plating, metal deposition or the like. As shown in FIGS. 25 and 26, the optical surface 714 has a first optical surface 714a formed at the center portion, and second optical surfaces 714b, 714b formed at both the horizontal end portions. As shown in FIGS. 25 to 27, the front shape of the first optical surface 714a is part of an elliptic surface in which a radius $r_1$ in the X-direction is longer than the radius $r_2$ in the Y-direction where the center axis C of the LED 710 shown in FIG. 23 is taken as the Z-axis, the horizontal line passing through the origin O and being perpendicular to the Z-axis is taken as the X-axis, and the vertical line passing through the origin O and being perpendicular to the Z-axis is taken as the Y-axis. The sectional shape taken along the plane perpendicular to the Z-axis of the first optical surface 714a is the same as the front shape. Both the end portions of the first optical surface 714a in the X-direction (shown by the two-dot chain line in FIGS. 25 and 26) are cut away by the second optical surfaces 714b, 714b. Here, in FIG. 23, the origin O is the intersection formed between a plane including the surfaces of the lead frames 712a, 712b on the side where the LED chips 711a, 711b are mounted and the center axisc. As shown in FIG. 27, in the Y-Z plane, the first optical surface 714a is formed in such a concave surface that an angle α between the end portion of the first optical surface 714a and the X-Y plane becomes a value of from 35° to 55°. As shown in FIGS. 25 to 27, assuming that the plus directions of the X-axis, y-axis and Z-axis are taken as those shown by respective arrows, the first optical surface 714a is expressed by the following equation:

$Z=f(r), r=\sqrt{(x^2+ky^2)}, 0<k<1$

As shown in FIGS. 25 and 26, the second optical surfaces 714b, 714b are part of a spherical surface in which the center portion (shown by the dotted line in FIGS. 25 and 26) is cut-away by the first optical surface 714a. A radius $r_3$ of a circle formed by cut-away of the spherical surface by the X-Y plane is shorter than the radius $r_1$ of the first optical surface 714a in the X-direction and is longer than the radius $r_2$ of the optical surface 714a in the Y-direction.

As shown in FIGS. 23 to 28, the rearmost LED 720 has an LED chip 721 emitting rays of blue light; lead frames 722a, 722c; a light transmissible material 723 having a refractive index being approximately the same as that of the light transmissible material 713 used in the LED 710; a reflection surface 724 provided to face to the light emitting surface of the LED chip 721; a radiation surface 725 provided on the back surface of the LED chip 721; and a wire 726. As shown in FIG. 23, the LED chip 721 is mounted such that the position of the LED chip 721 relative to the reflection surface 724 corresponds to the position of the LED chip 711a emitting rays of red light in the LED 710 relative to the optical surface 714. The LED chip 721 is mounted at the leading edge portion of the lead frame 722a, and is electrically connected to the lead frame 722c by means of the wire 726. The light transmissible material 723 integrally seals the LED chip 721, the leading edge portions of the lead frames 722a, 722c, and the wire 726.

As shown in FIG. 23, the radiation surface 725 is obtained by forming the surface of the light transmissible material 723 in a flat shape. The reflection surface 724 is obtained by a method wherein the whole convex surface of the light transmissible material 723 in the LED 720 is subjected to mirror-surface treatment by plating, metal deposition or the like. In addition, the shape of the reflection surface 724 is substantially the same as that of the optical surface 714 of the LED 710, and the detail explanation thereof is omitted.

As shown in FIG. 23, the spacer 730 is formed of a light transmissible material having a refractive index approximately the same as that of the light transmissible material of the LEDs 710, 720. This prevent that the rays of light emitted by the LED 720 are refracted at the interface of the optical surface 714 and radiated in the ineffective directions. In the spacer 730, the front surface is formed in a shape to be closely connected to the optical surface 714 of the LED 710, and the rear surface is formed in a shape to be closely connected to the radiation surface 725 of the LED 720.

Between the front surface of the spacer 730 and the optical surface 714 and between the rear surface of the spacer 730 and the radiation surface 725, adhesive of a light transmissible material having a refractive index approximately the same as that of the light transmissible material of the spacer 730 is preferably interposed therebetween upon connection. This eliminates the interfacial reflection of rays of blue light emitted by the LED chip 720, which is generated when they transmit between the radiation surface 725 and the rear surface of the spacer 730 and between the front surface of the spacer 730 and the optical surface 714. However, even when no adhesive is interposed therebetween, the thickness of an air layer formed at the connection portion between the LED and the spacer is small because the connection surface of the LED corresponds to that of the spacer, thereby preventing the generation of a large deviation in the optical path due to the interfacial reflection. In the case where adhesive is interposed therebetween, it becomes possible to eliminate the interfacial reflection loss of about 8% due to the air layer, In the multi-layer type light emitting device 700 having the above construction, part of rays of red light emitted by the LED chip 711a of the LED 710 and part of rays of green light emitted by the LED chip 711b are reflected from a plurality of the dotted reflection portions 714c formed on the optical surface 714, and then radiated from the radiation surface 715 to the exterior. Here, the rays of light reflected from the first optical surface 714a of the optical surface 714 have a wide luminous intensity distribution including the center axial direction with respect to the horizontal direction (X-axis direction in FIG. 25), and have a narrow luminous intensity distribution with respect to the vertical direction (Y-axis direction in FIG. 25). On the other hand, the rays of light reflected from the second optical surface 714b of the optical surface 714 are horizontally reflected in the range between the direction approximately parallel to the center axis and the direction inclined toward the center axis. In addition, since the LED chip 711a and the LED chip 711b are mounted at the positions approximately symmetric to each other in the horizontal direction relative to the center axis, the rays of red light emitted by the LED chip 711a and the rays of green light emitted by the LED chip 711b are reflected from the optical surface 714, with the luminous intensity distribution characteristics being approximately symmetric to each other in the horizontal direction relative to the center axis.

The whole luminous flux of the rays of blue light emitted by the LED chip 721 of the LED 720 are almost reflected from the reflection surface 724 and radiated from the radiation surface 725, after which they transmit the spacer 730 and reach the optical surface 714 of the LED 710. Of the rays of light reaching the optical surface 714, ones reaching portions of the optical surface 714 where no reflection portions 714c are formed transmit the optical surface 714 and are radiated from the radiation surface 715 to the exterior. In addition, since the center axis of the LED 710 corresponds to that of the LED 720, the reflection surface 724 is formed in a shape being approximately the same as that of the optical surface 714, and the LED chip 721 is mounted such that the position of the LED chip 721 relative to the reflection surface 724 corresponds to the position of the LED chip 711a relative to the optical surface 714, the rays of blue light emitted by the LED chip 721 are reflected with approximately the same luminous intensity distribution characteristic as that of rays of red light emitted by the LED chip 711a and reflected from the optical surface 714.

Figure 29:
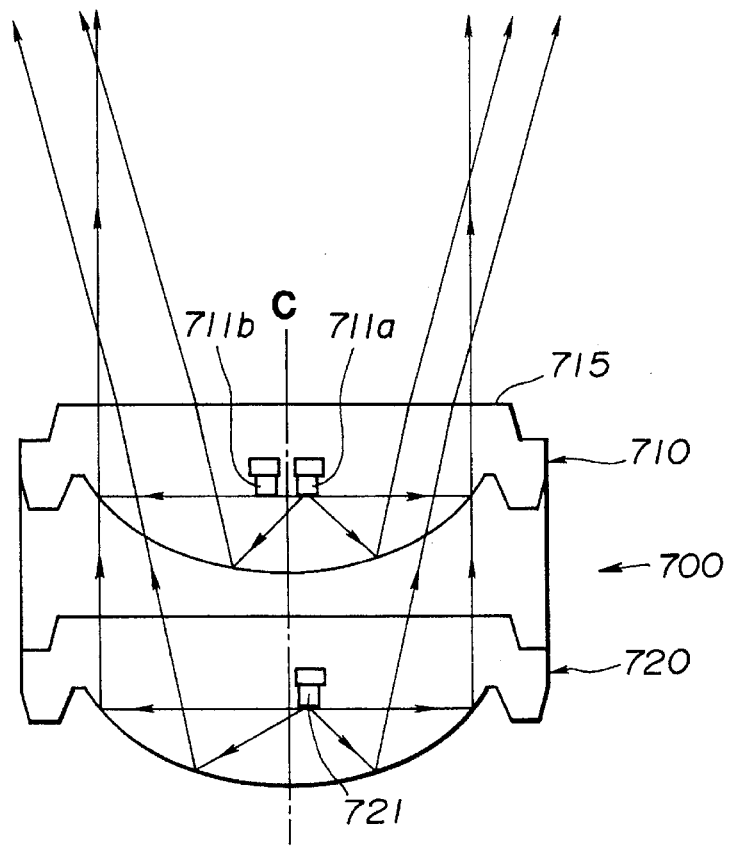
FIG. 29 is a view for illustrating an optical path of the multi-layer type light emitting device as the seventh embodiment.

When the multi-layer type light emitting device 700 having the above construction is observed from the front side, since each of the dotted reflection portions 714c formed on the optical surface 714 has a micro-size and as shown in FIG. 29, the LEDs 710, 720 emit rays of light forwardly from approximately the same position of the radiation surface 715, the rays of red light and green light emitted by the LED 710 are visually observed to be mixed with the rays of blue light emitted by the LED 720. On the other hand, when the device 700 is obliquely observed from the front side, the LEDs 710, 720 radiate rays of light in the direction of the visual observation from different positions of the optical surface 715 as shown in FIG. 29; however, the deviation in the radiation position is not more than the radius of the radiation surface 715. Moreover, as the observation position is obliquely shifted from the front surface, the deviation in the radiation position is visually observed to be relaxed, so that the rays of red light and green light emitted by the LED 710 and the rays of blue light emitted by the LED 720 can be visually observed to be mixed just as in the case of the observation from the front side.

According to the above seventh embodiment, since the LED chips 711a, 711b are mounted at the positions approximately symmetric to each other in the horizontal direction relative to the center axis, the rays of red light emitted by the LED chip 711a and the rays of green light emitted by the LED chip 711b are reflected from the optical surface 714 with the luminous intensity distribution characteristics being approximately symmetric to each other in the horizontal direction relative to the center axis.

In the seventh embodiment, the center axis of the LED 710 corresponds to that of the LED 720; the reflection surface 724 is formed in a shape being approximately the same as that of the optical surface 714; and the LED chip 721 is mounted such that the position of the LED chip 721 relative to the reflection surface 724 corresponds to the position of the LED chip 711a relative to the optical surface 714, so that the rays of red light emitted by the LED chip 711a of the LED 710 and the rays of blue light emitted by the LED 720 can be radiated to the exterior with approximately the same luminous intensity distribution characteristic. As a result, the rays of red light and blue light, which are difficult to be mixed as compared with the mixing of the rays of red light and green light and of the rays of green light and blue light, can be effectively mixed.

Figure 30A:
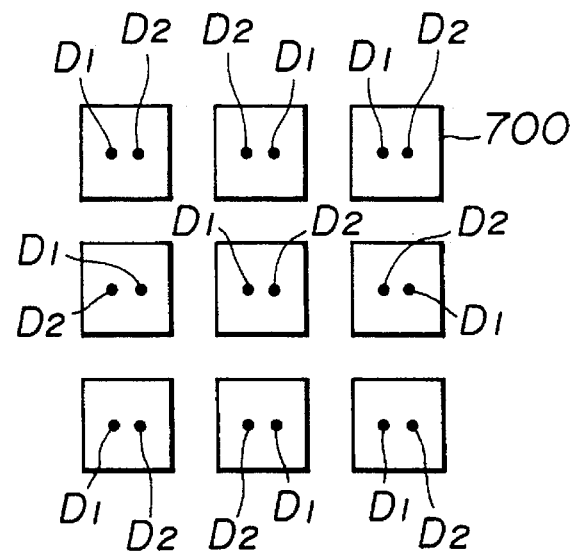
FIGS. 30(a) to 30(c) are views for illustrating the visual observation of a 3×3 dot matrix prepared using the multi-layer type light emitting device as the seventh embodiment.
Figure 30B:
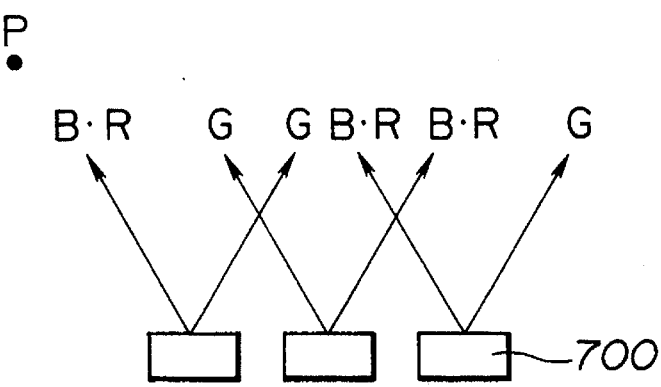
Figure 30C:
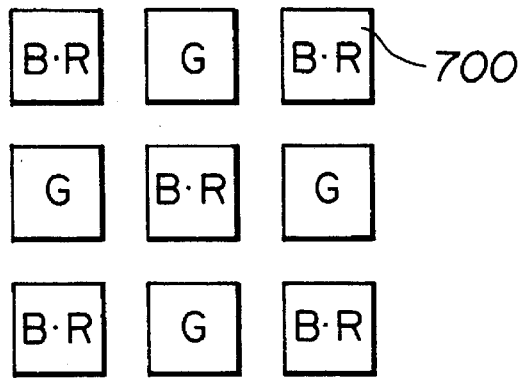

FIGS. 30(a) to 30(c) are views for illustrating the visual observation of a 3×3 dot matrix fabricated using the multi-layer type light emitting device 700 having the above construction. As shown in FIG. 30(a), the dot matrix is disposed such that the LED chips adjacent to each other in the vertical and horizontal directions in the multi-layer type light emitting device are arranged to be reversed, as seen from the front surface. In FIGS. 30(a) to 30(c), D1 indicates the LED chip 711a, and D2 is the LED chip 711b; and R, B and G indicate red light, blue light and green light, respectively. In the multi-layer type light emitting device 700 in this embodiment, as described above, rays of red light and blue light are radiated to the exterior with approximately the same luminous intensity distribution characteristics; while rays of green light and red light are radiated to the exterior with the luminous intensity distribution characteristics approximately symmetric to each other relative to the center axis. Accordingly, the peak appearing on the first line of the dot matrix in the horizontal light radiation direction is that shown in FIG. 30(b). When the dot matrix is observed from a P point of the FIG. 30(b), it is visually observed as shown in FIG. 30(c). Namely, the rays of red light and blue light, which are difficult to be visually observed as being mixed, are visually observed as being radiated from approximately the same position, that is, the same multi-layer type light emitting device to the exterior with approximately the same luminous intensity distribution characteristics. As a result, the rays of red light and the blue light can be sufficiently visually observed even from a portion relatively near thereto. On the other hand, the rays green light, which have approximately the same luminous intensity distribution characteristics as those of the rays of red light and green light, are visually observed as being exteriorly radiated from a position apart from those of the rays of red light and blue light, that is, from an adjacent multi-layer type light emitting device. However, the rays of green light and red light, and the rays of green light and the blue light are easy to be visually observed as being mixed, so that in the dot matrix shown in FIGS. 30(a) to 30(c), all of the rays of red light, green light and blue light can be visually observed as being effectively mixed.

According to the seventh embodiment, each of the LEDs 710, 720 has the luminous intensity distribution characteristics being wide in the horizontal direction, and exhibits a visibility being wide in the horizontal direction without any lens and prism on the front surface. The device in this embodiment, therefore, is suitable for outdoor displays and the like.

In the seventh embodiment, the first optical surface 714a is formed at the center portion of the optical surface 714 of the LED 710 and the second optical surfaces 714b, 714b are formed at both the horizontal end portions of the optical surface 714, so that rays of light reflected from both the horizontal end portions of the optical surface 714, that is, rays of light reflected from the second optical surfaces 714b, 714b do not reach the side surface of the multi-layer type light emitting device 700 and are radiated from the radiation surface 715 to the exterior, as shown in FIG. 29. Moreover, since the reflection surface 724 of the LED 720 is formed in a shape being approximately the same as that of the optical surface 714, rays of light reflected from both the horizontal end portions of the reflection surface 724 do not reach the side surface of the multi-layer type light emitting device 700 and are radiated from the radiation surface 715 to the exterior, as shown in FIG. 29. Accordingly, it becomes possible to prevent a reduction in the exterior radiation efficiency of each of the LEDs 710, 720. The other effects are the same as those in the first embodiment.

In the seventh embodiment, the optical surface 714 of the LED 710 has the first optical surface 714a formed on the center portion and the second optical surfaces 714b, 714b formed at both the horizontal ends; however, the present invention is not limited thereto.

In the seventh embodiment, the optical surface 714 is formed on the surface of the light transmissible material 713 of the LED 710; however, the present invention is not limited thereto. For example, the optical surface 714 may be not formed on the surface of the light transmissible material 713 of the LED 710 but on the front surface of the spacer 730.

In the seventh embodiment, in the rearmost LED 720, the LED chip 721 emitting rays of blue light is mounted such that the position thereof relative to the reflection surface 724 corresponds to the position of the LED chip 711a emitting rays of red light relative to the optical surface 714; however, the present invention is not limited thereto. The rearmost LED 720 may be so constructed that the LED chip 721 is mounted along the center axis.

In the seventh embodiment, the spacer 730 is disposed between the LEDs 710, 720; however, the present invention is not limited thereto. For example, as described in the first embodiment shown in FIG. 2, in place of the spacer 730, a space between the LEDs 710, 720 is filled with a light transmissible material. Moreover, as described in the fifth embodiment shown in FIG. 18, the radiation surface of the rearmost LED may be formed in a shape complementary to the optical surface 714 of the LED 710 and closely connected thereto. In this case, the optical surface 714 may be formed on the surface (on which the radiation surface is originally formed) of the light transmissible material of the rearmost LED in place of being formed on the surface of the light transmissible material 713 of the LED 710.

Moreover, in the seventh embodiment, the LED having the LED chip 711a emitting rays of red light and the LED chip 711b emitting rays of green light is multi-layered on the rearmost LED having the LED chip 721 emitting rays of blue light; however, the present invention is not limited thereto. For example, in the seventh embodiment, the rearmost LED 720 may include an LED chip emitting rays of green light in addition to the LED chip 721 emitting rays of blue light. In this case, preferably, the position of the LED chip emitting rays of green light relative to the reflection surface 724 corresponds to the position of the LED chip 711b emitting rays of green light relative to the optical surface 714.

Figure 31:
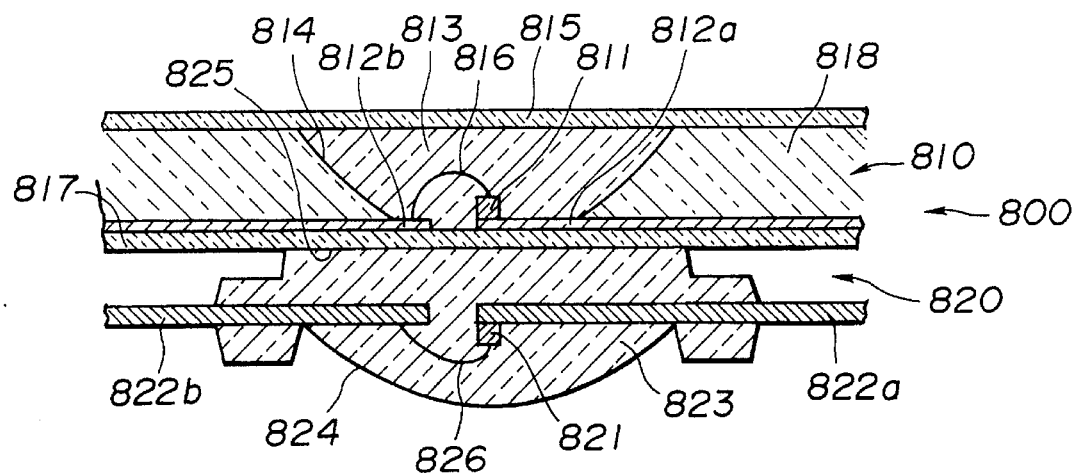
FIG. 31 is a schematic sectional view of a multi-layer type light emitting device as an eighth embodiment of the present invention.

An eighth embodiment of the present invention will be described below with reference to FIG. 31. As shown in FIG. 31, a multi-layer type light emitting device 800 as the eighth embodiment of the present invention includes an LED 810 and a rearmost LED 820 disposed on the rear stage of the LED 810.

The LED 810 has an LED chip 811 emitting rays of green light; a light transmissible or light semi-transmissible circuit board 817 on which the LED chip 811 is mounted with the light emitting surface directed upward; conducting portions 812a, 812b formed on the circuit board 817; a light transmissible material 813; a flat optical board 818 made of a light transmissible material and having an annular optical surface 814 provided to surround the side surface of the LED chip 811; a light transmissible front surface plate 815 provided on the light emitting surface side of the LED chip 811; and a wire 816. The LED chip 811 is mounted on the conducting portion 812a and is electrically connected to the conducting portion 812b by means of the wire 816. The light transmissible material 813 fills a space between the circuit board 817 and the front surface plate 815 so as to integrally seal the LED chip 811 and the wire 816. The annular optical surface 814 is formed in a half-mirror shape by control of the sticking amount of a metal when the concave portion of the optical board 818 is subjected to mirror-surface treatment by plating, metal deposition or the like. The annular optical surface 814 is formed in a revolving parabolic surface shape focussed on the LED chip 811, and the top portion thereof is cut by the circuit board 814. In addition, to prevent the short-circuit between the conducting portions 812a, 812b, at the boundary portion between the conducting portions 812a, 812b and the annular optical surface 814, the conducting portions 812a, 812b is required to be subjected to insulating treatment or portions not subjected to mirror-surface treatment is required to be provided on the annular optical surface 814.

The rearmost LED 820 has an LED chip 821 emitting rays of red light; lead frames 822a, 822b; a light transmissible material 823 having a refractive index being approximately the same as that of the light transmissible material 813 of the LED 810; a reflection surface 824 provided to face to the light emitting surface of the LED chip 821; a radiation surface 825 provided on the back surface of the LED chip 821; and a wire 826. The LED chip 821 is mounted at the leading edge portion of the lead frame 822a, and is electrically connected to the lead frame 822b by means of the wire 826. The LED chip 821, the leading edge portions of the lead frames 822a and 822b, and the wire 826 are integrally sealed by the light transmissible material 823. The reflection surface 824 is formed by a method wherein the convex surface of the light transmissible material 823 is subjected to mirror-surface treatment by plating, metal deposition or the like. It is formed in a revolving parabolic surface shape focussed on the LED chip 821. The radiation surface 825 is flatly formed on the surface of the light transmissible material 823, and is closely connected to the back surface of the circuit board 817.

In the multi-layer type light emitting device 800 having the above construction, of rays of green light emitted by the LED chip 811 of the LED 810, part of ones reaching the half-mirror like annular optical surface 814, is reflected in the direction approximately parallel to the center axis, after which they transmit the light transmissible front surface plate 815 and are radiated to the exterior as the parallel rays of light. Of the rays of green light emitted by the LED chip 811, ones directly reaching the front surface plate 815 excluding a light component vertically coming in the front surface plate 815 are refracted when they transmit the front surface plate 815, and are radiated to the exterior. In the meanwhile, the whole luminous flux of red light emitted by the LED chip 821 of the LED 820 is almost reflected from the reflection surface 824 in the direction approximately parallel to the center axis, and then radiated from the radiation surface 825, after which they transmit the light transmissible or light semi-transmissible circuit board 817, half-mirror like annular optical surface 814 and light transmissible front surface plate 815 and are radiated to the exterior as the parallel rays of light.

According to the eighth embodiment, the rays of green light emitted by the LED chip 811 and reflected from the annular optical surface 814, and the rays of red light emitted by the LED chip 821 and reflected from the reflection surface 824 are radiated approximately in the same direction from approximately the same position of the front surface plate 815 as the parallel rays of light, so that the rays of green light and red light can be effectively mixed and radiated to the exterior. The other effects are the same as those in the first embodiment.

In the eighth embodiment, the diameter of the annular optical surface 824 is not limited to be equal to that of the reflection surface 824, and it may be smaller than that of the reflection surface 824. By making smaller the diameter of the annular optical surface than that of the reflection surface, rays of red light emitted by the LED chip 821, and rays of green light emitted by the LED chip 811 which is presently smaller in light emitting power than the LED chip emitting rays of red light can be radiated to the exterior with a preferable balance.

A ninth embodiment of the present invention will be described with reference to FIG. 32. In this embodiment, parts having the same functions as those of the multi-layer type light emitting device 800 in the eighth embodiment are indicated at the same or corresponding characters, and the detail explanation thereof is omitted.

Figure 32:
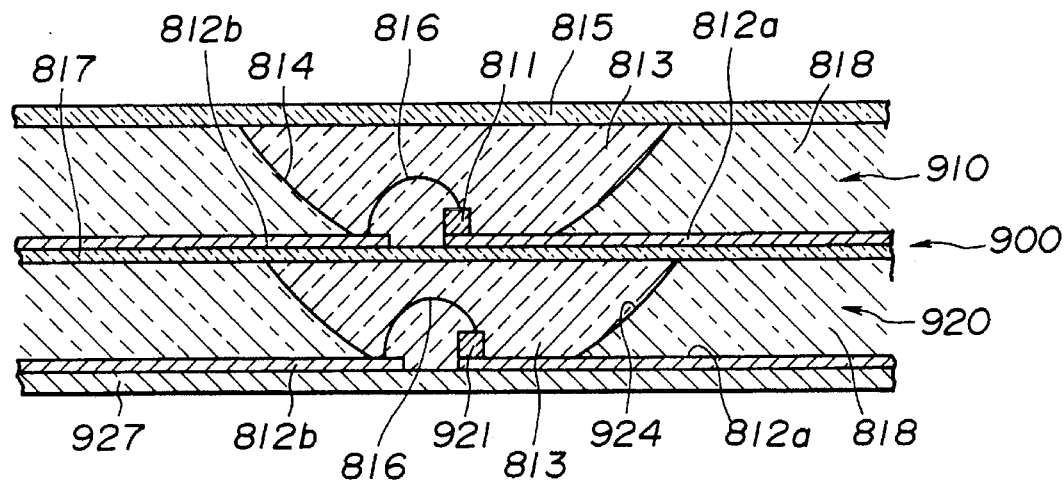
FIG. 32 is a schematic sectional view of a multi-layer type light emitting device as a ninth embodiment of the present invention.

As shown in FIG. 32, a multi-layer type light emitting device 900 as the ninth embodiment of the present invention includes an LED 910, and a rearmost LED 920 disposed at the rear stage of the LED 910. The LED 910 has the same construction as that of the LED 810 used in the eighth embodiment. The LED 920 has the same construction as that of the LED 910, except that the LED chip 811 emitting rays of green light is replaced with an LED chip 921 emitting rays of red light; the light transmissible or light semi-transmissible circuit board 817 is replaced with a circuit board 927 which is made of a material having a high refractive index and formed with conducting portions 812a, 812b; and the half-mirror like optical surface 814 is replaced with a reflection surface 924 made of a metal deposition film or the like which is formed on a concave surface portion of the optical board 818.

According to the ninth embodiment, since the rays of green light emitted by the LED chip 811 and reflected from the optical surface 814, and the rays of red light emitted by the LED chip 921 and reflected from the optical surface 924 are radiated from approximately the same position of the front surface plate 815 approximately in the same direction as the parallel rays of light, the rays of green light and red light can be effectively mixed and radiated to the exterior. The other effects are the same as those in the first embodiment.

The present invention is not limited to each of the above embodiments, and can include various modifications without departing from the scope of the present invention. For example, the number of the LEDs disposed to be multi-layered is not limited to that used in each of the above embodiments. For example, four pieces or more of LEDs may be disposed to be multi-layered. In this case, by combination of LEDs of the same wavelength or different wavelengths which are different in luminous intensity distribution characteristics, rays of light having various luminous intensity distribution characteristics can be radiated. For example, rays of light having luminous intensity distribution characteristics steppedly changed can be radiated. In the case where three pieces or more of LEDs are multi-layered, the LEDs used in the above embodiments (excluding the rearmost LED) may be disposed in combination.

The combination of the luminous colors of the LED chips is not limited to each of the above embodiments. A plurality of LED chips may be used for one LED. In this case, LED chips having different luminous wavelengths may be combined. Moreover, in each of the above embodiments, the PN junction type chip is used as a light emitting source; however, the present invention is not limited thereto. For example, an MIS type chip may be used as the light emitting source.

The rearmost LED is not limited to the type using the LED chip described in each of the above embodiments. For example, it may be constituted of a cold cathode ray tube or EL lamp.

In each of the above embodiments, to further extend the luminous intensity distribution characteristics, a lens, prism, diffusion plate and the like may be disposed on the front side. For example, by making rays of light with three-principle colors in parallel once as described in the second embodiment and then diffusing them, the rays of the mixed light in which the balance of color components is kept constant can be radiated from all the positions. This multi-layer type light emitting device can obtain rays of mixed light which is visually observed as being mixed from a portion near thereto, being wide in luminous intensity distribution, and has a high luminance, and accordingly, it is suitable for a full-color display. A lens may be also disposed on the front side for collecting rays of light, and the collected rays of light may be communicated to an optical fiber.

In each of the above embodiments, a space between the optical surface and the radiation surface or between the reflection surface and the radiation surface in the LED is filled with a light transmissible material; however, the present invention is not limited thereto. The space between the optical surface and the radiation surface or between the reflection surface and the radiation surface may be hollowed.

Figure 33:
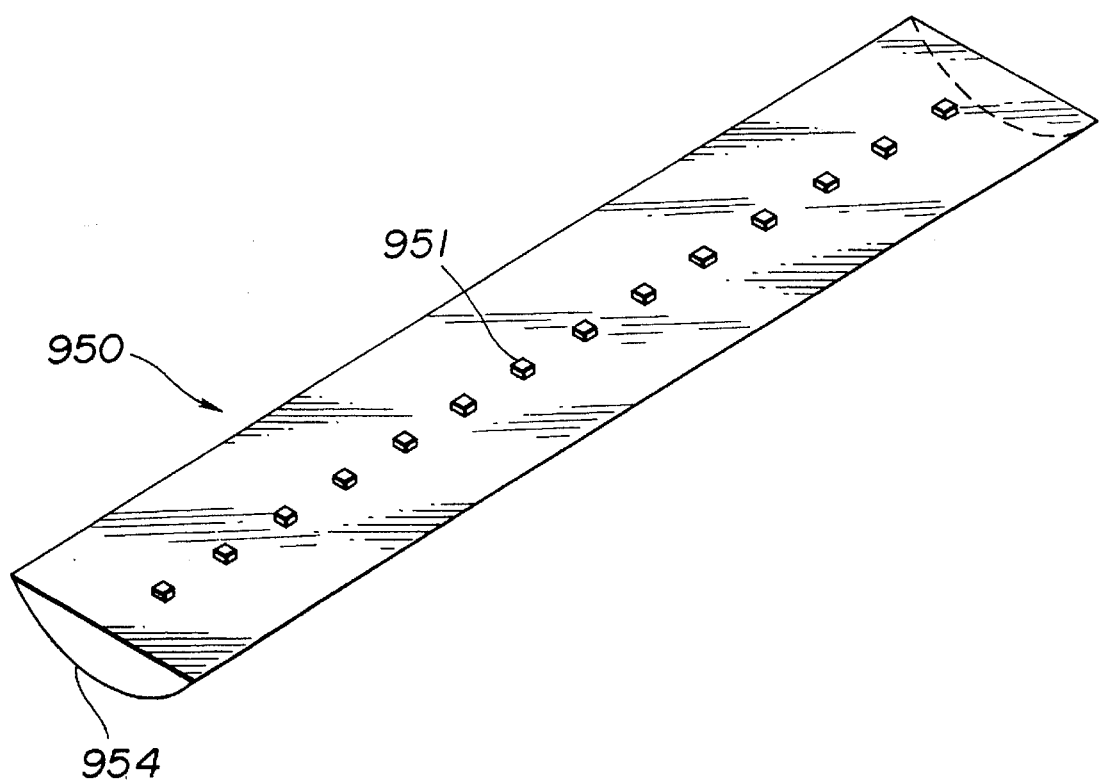
FIG. 33 is a view showing a modification of the LED used in the multi-layer type light emitting device of the present invention.
Figure 34:
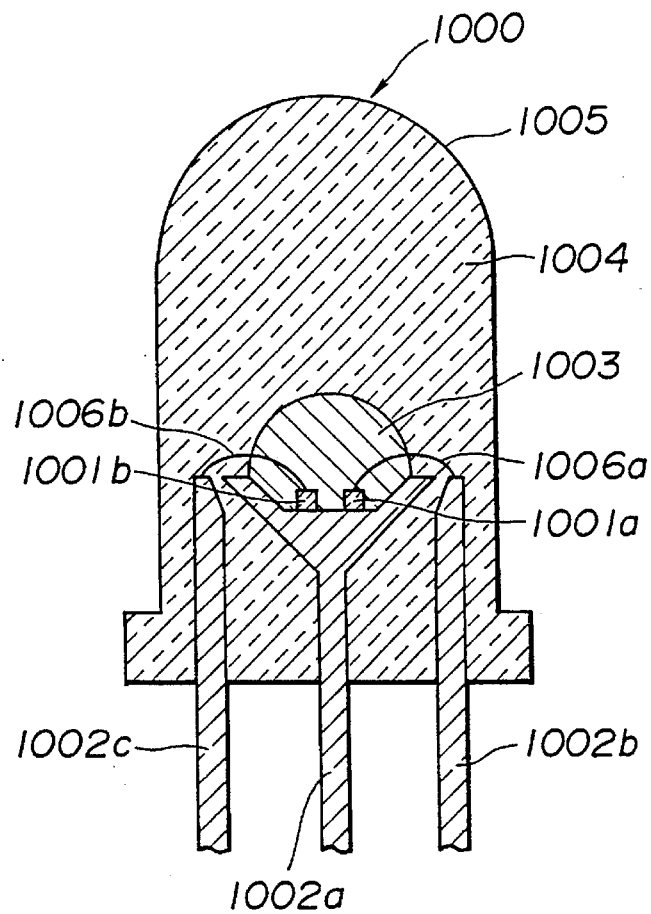
FIG. 34 is a schematic sectional view of a prior art lens-type LED.
Figure 35:
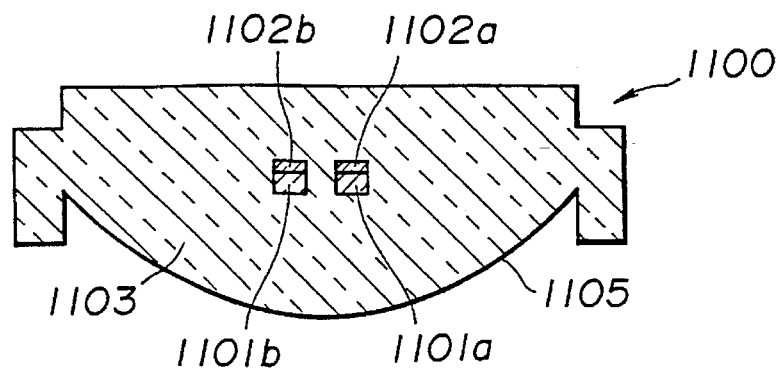
FIG. 35 is a schematic view of a prior art reflection type LED.

The shape of the LED used in the multi-layer type light emitting device of the present invention is not limited to that used in each of the above embodiments. For example, as the LED 950 shown in FIG. 33, the optical surface 954 may be formed in a concave cylindrical surface and a plurality of LED chips 951 may be linearly mounted along the axis of the optical surface 954. The LED 950 is most preferable as a reading light source for OA equipment.

What is claimed is:

1. A multi-layer type light emitting device, comprising:
   at least two light emitting sources, successively disposed along a light-transmitting path, including a rearmost source at a rear end of the path and a front source at a front end of the path, for transmitting rays of light along the path, the rearmost source emitting rays of light in a forward direction from the rear end toward the front end; and
   means defining a respective optical surface for each source except the rearmost source, disposed along the path between the front source and the rearmost source, for reflecting in the forward direction rays of light emitted by each source except the rearmost source, and for transmitting therethrough in the forward direction rays of light emitted by the rearmost source.

2. A multi-layer type light emitting device according to claim 1, which further comprises a reflection surface disposed so as to correspond to said rearmost light emitting source, for reflecting rays of light emitted by said rearmost light emitting source and radiating the rays of light in the forward direction.

3. A multi-layer type light emitting device according to claim 1, wherein said light emitting sources emit rays of light with different luminous wavelength ranges, respectively.

4. A multi-layer type light emitting device according to claim 3, wherein said light emitting sources include ones emitting rays of red or nearly red light, green or nearly green light and blue or nearly blue light respectively.

5. A multi-layer type light emitting device according to claim 1, wherein at least one of said light emitting sources emits ray of light with two or more luminous wavelength ranges.

6. A multi-layer type light emitting device according to claim 1, wherein said at least two light emitting sources includes three light emitting sources, and wherein the respective optical surface for each light emitting source except the rearmost source each reflects rays of light emitted by said light emitting source with approximately the same luminous intensity distribution characteristics.

7. A multi-layer type light emitting device according to claim 1, wherein said optical surface is a light semi-transmissible thin film reflection surface, or said optical surface is formed by a method wherein reflection portions are partially formed on a light transmissible surface.

8. A multi-layer type light emitting device according to claim 1, wherein said optical surface is a wavelength selective surface.

9. A multi-layer type light emitting device according to claim 8, wherein said optical surface is a dichroic mirror formed by multi-layering of thin films having different refractive indexes.

10. A multi-layer light emitting device according to claim 2, wherein each of said light emitting sources has at least one LED chip with a luminous surface thereof directed rearwardly; and wherein each of said optical surface and said reflection surface of each of said sources is a concave surface facing a luminous surface of said at least one LED chip.

11. A multi-layer type light emitting device according to claim 10, wherein the respective optical surface and said LED chip of each source, except the rearmost source, and said reflection surface and said LED chip are each integrally formed of a first light transmissible material, thereby forming respective LEDs.

12. A multi-layer type light emitting device according to claim 11, wherein each LED is disposed in such a manner that a front surface thereof is complementary to and closely connected with a rear surface of an LED of a source positioned forward thereof.

13. A multi-layer type emitting device according to claim 11, further comprising a second light transmissible material having a refractive index approximately the same as that of the first light transmissible material filling a space between LEDs of successive ones of the sources.

14. A multi-type light emitting device according to claim 11, further comprising a spacer having a front surface closely connected with a rear surface of the LED of the front source, said spacer having a rear surface closely connected with a front surface of the LED of the rearmost source said spacer being disposed between successive ones of the LEDs, said spacer being formed of a second light transmissible material having a refractive index approximately the same as that of said first light transmissible material.

15. A multi-type light emitting device according to claim 10, further comprising a light transmissible material sealing said each LED chip, a surface on a light emitting surface side of each LED chip being formed to be complimentary to said optical surface or said reflection surface for the source having the LED chip, and wherein said optical surface is formed on a front surface of the light transmissible material sealing the LED of the rearmost source.

16. A multi-layer type light emitting device according to claim 11, wherein an incident surface is provided on the path rearward of each optical surface, in spaced relation thereto, further comprising a further light transmissible material filling a space between said incident surface and said optical surface, wherein rays of light emitted on the path rearward of the incident surface in the forward direction pass through the incident surface, the further light transmissible material and the optical surface.

17. A multi-layer type light emitting device according to claim 1, wherein the at least two light emitting sources includes at least three light emitting sources, successively disposed along the light-transmitting path, the at least three light emitting sources including the front source and at least two rear sources, the at least two rear source including the rearmost source, each optical surface transmitting therethrough in the forward direction rays of light emitted by each rear source that is disposed between the optical surface and the rear end.

18. A multi-layer type light emitting device, comprising:

at least two light emitting sources, successively disposed along a light-transmitting path, including a rearmost source at a rear end of the path and a front source at a front end of the path, for transmitting rays of light along the path in a forward direction from the rear end toward the front end; and means defining a respective optical surface for each source except the rearmost source, disposed along the path between the front source and the rearmost source, for reflecting in the forward direction rays of light emitted by each source except the rearmost source, and for transmitting therethrough in the forward direction rays of light emitted by the rearmost source;

wherein each of the light emitting sources, except the rearmost source, is a semiconductor LED chip.

19. A multi-layer type light emitting device according to claim 18, wherein the at least two light emitting sources includes at least three light emitting sources, successively disposed along the light-transmitting path, the at least three light emitting sources including the front source and at least two rear sources, the at least two rear source including the rearmost source, each optical surface transmitting therethrough in the forward direction rays of light emitted by each rear source that is disposed between the optical surface and the rear end.

20. A multi-layer type light emitting device, comprising:

at least two light emitting sources, successively disposed along a light-transmitting path, including a rearmost source at a rear end of the path and a front source at a front end of the path, for transmitting rays of light along the path in a forward direction from the rear end toward the front end; and means, provided for each source except the rearmost source, and disposed along the path between the front source and the rearmost source, for reflecting rays of light emitted by each source except the rearmost source in the forward direction and for transmitting therethrough in the forward direction rays of light emitted by the rearmost source;

wherein each of the light emitting sources, except the rearmost source, has at least one LED chip mounted with a luminous surface facing in the forward direction; and wherein the means for reflecting and transmitting that is provided for each source except the rearmost source includes a light transmissible or light semi-transmissible circuit board on which the at least one LED chip thereof is provided, and a flat optical board formed of a light transmissible material, the light transmissible material having an annular optical surface surrounding a side surface of the at least one LED chip.

21. A multi-layer type light emitting device according to claim 20, wherein the at least two light emitting sources includes at least three light emitting sources, successively disposed along the light-transmitting path, the at least three light emitting sources including the front source and at least two rear sources, the at least two rear source including the rearmost source, each optical surface transmitting therethrough in the forward direction rays of light emitted by each rear source that is disposed between the optical surface and the rear end.

* * * * *